(12) United States Patent
Sorgeloos et al.

(10) Patent No.: US 10,181,464 B2
(45) Date of Patent: Jan. 15, 2019

(54) SEMICONDUCTOR DEVICE FOR ELECTROSTATIC DISCHARGE PROTECTION

(71) Applicant: Sofics BVBA, Gistel (BE)

(72) Inventors: Bart Sorgeloos, Gistel (BE); Benjamin Van Camp, Gistel (BE); Olivier Marichal, Gistel (BE)

(73) Assignee: SOFICS BVBA, Gistel (BE)

( * ) Notice: Subject to any disclaimer, the term of this patent is extended or adjusted under 35 U.S.C. 154(b) by 11 days.

(21) Appl. No.: 15/625,024

(22) Filed: Jun. 16, 2017

(65) Prior Publication Data
US 2018/0006016 A1 Jan. 4, 2018

Related U.S. Application Data

(63) Continuation of application No. 14/500,623, filed on Sep. 29, 2014, now Pat. No. 9,685,431.

(60) Provisional application No. 61/883,658, filed on Sep. 27, 2013.

(51) Int. Cl.
*H01L 29/66* (2006.01)
*H01L 27/02* (2006.01)
*H01L 29/74* (2006.01)

(52) U.S. Cl.
CPC ...... *H01L 27/0262* (2013.01); *H01L 29/7436* (2013.01)

(58) Field of Classification Search
CPC ............. H01L 27/0262; H01L 27/0647; H01L 27/0266; H01L 27/0255; H01L 27/0259; H01L 27/0251; H01L 29/87

USPC ........ 257/176, E29.181, 355, 360, 362–363, 257/357, E29.225; 438/197–202
See application file for complete search history.

(56) References Cited

U.S. PATENT DOCUMENTS

| 5,625,522 | A | * | 4/1997 | Watt | H01L 27/0251 361/111 |
| 6,147,369 | A | * | 11/2000 | Chen | H01L 27/0262 257/124 |
| 6,501,137 | B1 | * | 12/2002 | Yu | H01L 27/0262 257/124 |
| 6,768,616 | B2 | * | 7/2004 | Mergens | H01L 27/0251 257/355 |
| 6,791,122 | B2 | * | 9/2004 | Avery | H01L 27/0255 257/173 |
| 6,803,633 | B2 | * | 10/2004 | Mergens | H01L 27/0292 257/173 |
| 9,881,914 | B2 | * | 1/2018 | Sorgeloos | H01L 29/87 |
| 2002/0079538 | A1 | * | 6/2002 | Su | H01L 27/0262 257/355 |

(Continued)

OTHER PUBLICATIONS

Jang et al., "Novel Diode-Chain Triggering SCR Circuits for ESD Protection," Solid-State Electronics 44, pp. 1297-1303 (2000).

*Primary Examiner* — Thao X Le
*Assistant Examiner* — Nduka Ojeh
(74) *Attorney, Agent, or Firm* — Volpe and Koenig, P.C.

(57) ABSTRACT

Disclosed is an electrostatic discharge (ESD) protection circuit. The ESD protection circuit may include a silicon controller rectifier (SCR) which may be triggered via at least one of its first trigger gate or second trigger gate. The ESD protection circuit may further include a highly doped region coupled to either the anode or cathode of the SCR, wherein the highly doped region may provide additional carriers to facilitate triggering of the SCR during an ESD event, whereby the SCR may be triggered more quickly.

22 Claims, 17 Drawing Sheets

(56) References Cited

U.S. PATENT DOCUMENTS

| | | | |
|---|---|---|---|
| 2004/0136127 A1* | 7/2004 | Kodama | H01L 27/0262 361/56 |
| 2006/0215337 A1* | 9/2006 | Wu | H01L 27/0262 361/56 |
| 2007/0131965 A1* | 6/2007 | Kim | H01L 27/0262 257/173 |
| 2008/0088994 A1* | 4/2008 | Lai | H01L 27/0262 361/56 |
| 2009/0045436 A1* | 2/2009 | Verleye | H01L 27/0262 257/173 |
| 2011/0204415 A1* | 8/2011 | Van Wijmeersch | H01L 27/0262 257/154 |

\* cited by examiner

SEMICONDUCTOR DEVICE FOR ELECTROSTATIC DISCHARGE PROTECTION

CROSS REFERENCE TO RELATED APPLICATION

This application is a continuation of U.S. patent application Ser. No. 14/500,623 filed Sep. 29, 2014, which claims the benefit of U.S. provisional application No. 61/883,658 filed Sep. 27, 2013, the contents of which are hereby incorporated by reference herein.

FIELD OF THE INVENTION

The invention generally relates to electrostatic discharge (ESD) protection. More specifically, the invention relates to the protection of circuits or nodes against ESD events such as charged device model (CDM) ESD events.

BACKGROUND OF THE INVENTION

During ESD, large currents may flow through an integrated circuit (IC), which can potentially cause damage to the IC. Damage can occur within a device included in the IC that conducts the current, as well as in devices that are exposed to a significant voltage drop across them due to the large current flow. To avoid damage due to an ESD event, clamps are added the IC design. These clamps shunt the large ESD current without causing high voltage over sensitive nodes of the IC.

Many conventional ESD clamps suffer from being too slow to trigger. In conventional ESD clamps, the time between the IC being exposed to the ESD event and triggering of the clamp is too long, such that the voltage over a node to be protected can exceed the maximum tolerated voltage for this node. The peak voltage experienced by the protected node during the reaction time of the ESD clamp is called the voltage overshoot. Device failures result from exposure to the maximum voltage allowed by a slow reaction time of the clamp.

A silicon controlled rectifier (SCR) is an example of a conventional clamp used for ESD protection. Conventional SCRs are known to have a high trigger voltage and a slow reaction time, making them seemingly impractical for ESD protection in advanced process nodes.

The high trigger voltage of the conventional SCR has been overcome by triggering the conventional SCR through either the G1 trigger gate, the G2 trigger gate, or both trigger gates of the conventional SCR. A trigger circuit applied to these nodes can be tuned to trigger at a desired voltage level.

For fast ESD events such as CDM events, the reaction time of conventional SCRs may be too slow. Therefore, there is a need to speed up the triggering of the conventional SCR. Hereinafter is disclosed embodiments of a ESD protection circuits with reduced SCR reaction time and thereby reduced voltage overshoot.

SUMMARY

An ESD protection circuit including a means to speed up triggering of an SCR is disclosed. The SCR may be triggered more quickly by providing a path for injecting minority carriers into the emitters of the bipolar transistors that form the SCR. The path is provided through impact ionization and avalanching of a region added in the SCR body. As avalanching is one of the fastest events within a silicon device, the injection of minority carrier will speed up the triggering of the SCR.

An embodiment of an ESD protection circuit may include a lowly doped P region, a lowly doped N region formed in the first lowly doped P region, a first highly doped P region formed entirely within the lowly doped P region, a second highly doped N region formed entirely within the lowly doped P region, a third highly doped P region formed entirely within the lowly doped N region, a fourth highly doped N region formed entirely within the lowly doped N region, and a fifth highly doped N region formed entirely within the lowly doped P region. The fifth highly doped N region may be coupled to the third highly doped P region. The ESD protection circuit may further include a trigger circuit coupled to at least one of the first highly doped P region and the fourth highly doped N region. The lowly doped N region, the lowly doped P region, and the second highly doped N region may form an NPN transistor. The third highly doped P region, the lowly doped N region, and the lowly doped P may form a PNP transistor. The NPN transistor and PNP transistor may form a silicon controller rectifier (SCR). The fifth highly doped N region may provide additional carriers to facilitate triggering of the SCR during an ESD event.

Another embodiment of an ESD protection circuit may include a gate, disposed above an area between the second highly doped N region and the fifth highly doped N region.

In another embodiment of an ESD protection circuit, the trigger circuit may include at least one of a transistor, a resistor, a diode, a capacitance, and an inductor.

In another embodiment of an ESD protection circuit, the trigger circuit may include at least a forward coupled diode.

Another embodiment of an ESD protection circuit may include a first resistor coupled between the first highly doped P region and the second highly doped N region.

Another embodiment of an ESD protection circuit may include a second resistor coupled between the third highly doped P region and the fourth highly doped N region.

In another embodiment of an ESD protection circuit, no highly doped regions may be placed in the silicon area between the third highly doped P region and the second highly doped N region.

In another embodiment of an ESD protection circuit, the distance between the third highly doped P region and the second highly doped N region may be minimized.

In another embodiment of an ESD protection circuit, no highly doped regions may be placed in the silicon area between the second highly doped N region and the fifth highly doped N region.

In another embodiment of an ESD protection circuit, the distance between the second highly doped N region and the fifth highly doped N region may be minimized.

Another embodiment of an ESD protection circuit may include a sixth highly doped P region formed entirely within the lowly doped N region, wherein the sixth highly doped P region may be coupled to the second highly doped N region. The second highly doped N region may be disposed between the fifth highly doped N region and the lowly doped N region, and wherein the third highly doped P region is disposed between the sixth highly doped P region and the lowly doped P region.

In another embodiment of an ESD protection circuit, the second highly doped N region may be disposed between the fifth highly doped N region and the lowly doped N region.

An embodiment of an ESD protection circuit may include a lowly doped P region, a lowly doped N region formed in the first lowly doped P region, a first highly doped P region formed entirely within the lowly doped P region, a second highly doped N region formed entirely within the lowly doped P region, a third highly doped P region formed entirely within the lowly doped N region, a fourth highly doped N region formed entirely within the lowly doped N region, and a fifth highly doped P region formed entirely within the lowly doped N region. The fifth highly doped N region may be coupled to the second highly doped N region. The ESD protection circuit may further include a trigger circuit coupled to at least one of the first highly doped P region and the fourth highly doped N region. The lowly doped N region, the lowly doped P region, and the second highly doped N region may form an NPN transistor. The third highly doped P region, the lowly doped N region, and the lowly doped P may form a PNP transistor. The NPN transistor and PNP transistor may form a silicon controller rectifier (SCR). The fifth highly doped N region may provide additional carriers to facilitate triggering of the SCR during an ESD event.

Another embodiment of an ESD protection circuit may include a gate, disposed above an area between the third highly doped P region and the fifth highly doped P region.

In another embodiment of an ESD protection circuit, no highly doped regions may be placed in the silicon area between the third highly doped P region and the fifth highly doped P region.

In another embodiment of an ESD protection circuit, the distance between the third highly doped P region and the fifth highly doped P region may be minimized.

In another embodiment of an ESD protection circuit, the third highly doped P region may be disposed between the fifth highly doped P region and the lowly doped P region.

BRIEF DESCRIPTION OF THE DRAWINGS

A more detailed understanding may be had from the following description, given by way of example and to be understood in conjunction with the accompanying drawings, wherein.

DETAILED DESCRIPTION OF THE INVENTION

The circuits described herein comprise wells of a conductivity type, wherein the conductivity type may be either N-type or P-type. In the following embodiments, a circuit may be implemented with conductivity types as depicted in the accompanying figure. Alternatively, the embodiments may be implemented such that each conductivity type is the opposite of that shown in the figures and described in the accompanying text. For instance, wherein a PNP bipolar transistor is described comprising a first region of P conductivity type, a second region of N conductivity type, and a third region of P conductivity type, the conductivities of the regions may be flipped such that an NPN bipolar transistor may be alternatively implemented comprising the first region of N conductivity type, the second region of P conductivity type, and the third region of N conductivity type.

Figure 2:
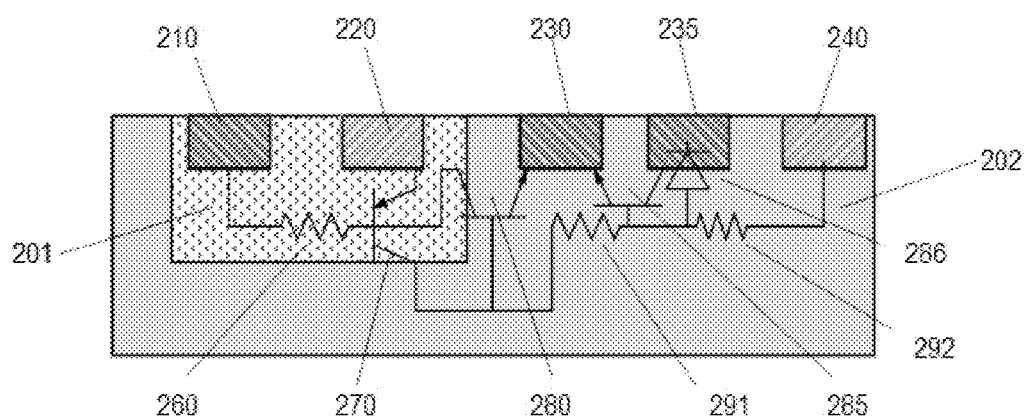
FIG. 2 shows a cross-sectional view of an embodiment of an ESD protection circuit.

In the following descriptions, common numerical designations may be used for similar, corresponding parts across multiple figures. In general, the part number will start with the figure number. For instance, anode region 220 as shown in FIG. 2 corresponds to similar anode region 520 shown in FIG. 5. Likewise, bipolar transistor 270 formed by regions 220, 201, and 202 shown in FIG. 2 corresponds to similar bipolar 1070 formed by regions 1020, 1001, and 1002 shown in FIG. 10. In some instances for clarity of illustration or due to the orientation of the figure, bipolar transistors may not be explicitly depicted in the figures. However, it should be understood that a bipolar x70 formed from regions x20, x01, and x02 in Figure x may be similar to bipolar y70 formed from regions y20, y01, and y02 in Figure y.

One of ordinary skill in the art should recognize a region may be viewed as serving multiple functions. For instance, a well region may serve as an emitter of a first transistor and as an anode of a silicon controlled rectifier (SCR). As such, in the following descriptions, the same region may be referred to by different nomenclature depending on the context of the function it serves in the foregoing description. As an example, one may encounter a description for a cathode 230 and later encounter a description for an emitter 230 referring to the same region. The numerical designation will provide an unambiguous notation for the region under consideration while the preceding descriptor should aid the readability of the description in the context of the description. Also, one of ordinary skill in the art should recognize that any region of certain doping type can vary in doping level throughout the region. This variation may be caused by one or multiple process steps.

Figure 1:
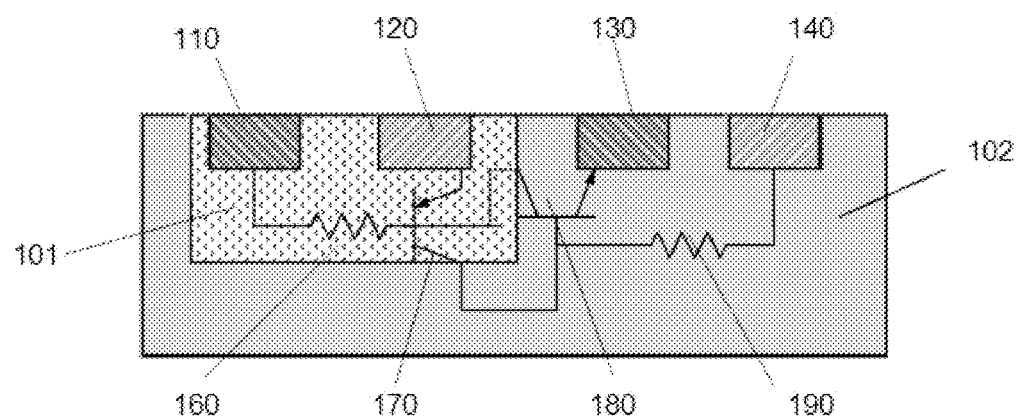
FIG. 1 shows a cross-section diagram of a conventional SCR.

FIG. 1 shows an example cross-sectional diagram of a conventional SCR. Highly doped N region 110 and highly doped P region 120 may be formed within a lowly doped N region 101. Lowly doped N region 101 may be formed within lowly doped P region 102. Highly doped N region 130 and highly doped P region 140 may be formed within lowly doped P region 102. Regions 101, 102, and 120 may form a PNP transistor 170. Regions 101, 102, and 130 may form an NPN transistor 180. Regions 140 and 110 may function as trigger gates G1 and G2, respectively. The arrangement of regions 101, 102, 120, and 130 may form the bipolar transistors 170 and 180 such that they form an SCR. The base of PNP 170 may be coupled to G2 110 via the intrinsic well resistance 160 of region 101. The base of NPN transistor 180 and collector of PNP transistor 170 may be coupled to G1 140 via the intrinsic well resistance 190 of region 102.

FIG. 2 shows an example cross-sectional diagram of an embodiment of an ESD protection circuit. As shown in FIG. 2, region 210 may be a highly doped N region, which may be formed entirely within a lowly doped N region 201 such that no portion of region 210 extends into another region bordering region 201, for example region 202. Region 220 may be a highly doped P region, which may be formed entirely within the lowly doped region 201 such that no portion of region 220 extends into another region bordering region 201. Region 201 may be formed in a lowly doped P region 202. The lowly doped P region 202 may be a P-well or a P substrate. In some processes, the lowly doped P region 202 may be placed in or may be surrounded by the lowly doped N region 201. Regions 220, 201, and 202 may form a PNP bipolar transistor 270. The base of the PNP 270 may be connected to the region 210 through the intrinsic well resistance 260 of region 201. The collector of the PNP 270, which may be formed by the region 202, may be connected via an intrinsic well resistance 291 and 292 of region 202 to the highly doped P region 240. The intrinsic well resistance may be alternatively the resistance of the collector. Region 240 may be formed entirely within the lowly doped P region 202 such that no portion of region 240 extends into another region bordering region 202. Region 230 may be a highly doped N region, which may be formed entirely within lowly doped P region 202 such that no portion of region 230 extends into another region bordering region 202. Regions 201, 202 and 230 may form an NPN bipolar transistor 280. The base of the NPN 280 may be connected to region 240 through the intrinsic well resistance 291 and 292 of region 202. The collector of the NPN 280 may be connected to region 210 through the intrinsic well resistance 260 of region 201. PNP 270 and NPN 280 may form an SCR. The collector of the PNP 270 and the base of the NPN 280 may be commonly formed by region 202, and the base of the PNP 270 and the collector of the NPN 280 may be commonly formed by region 201.

Region 210 may be referred to as the G2 trigger gate of the SCR. Region 220 may be referred to as the anode of the SCR, region 230 may be referred to as the cathode of the SCR, and region 240 may be referred to as the G1 trigger gate of the SCR.

FIG. 2 further depicts an additional region 235. This region 235 may be a highly doped N region. Region 235 may be formed entirely within the lowly doped P region 202 such that no portion of region 235 extends into another region bordering region 202, for example region 201. Region 235 may be connected to a high potential, for example the anode 220 of the SCR. Region 235 may alternatively be the combination of different dopings. For example, region 235 may comprise a highly doped P region formed in a lowly doped N region, wherein the lowly doped N region may be entirely formed within the lowly doped P region 202. Though not shown in FIG. 2, a trigger circuit may be connected between G2 210 and a lower potential (e.g. ground or cathode 230 of the SCR), a trigger circuit may be connected between G2 and a higher potential (e.g. a supply line, pad, or the anode 220 of the SCR), a trigger circuit may be connected between a higher potential and G1 240, a trigger circuit may be connected between G1 240 and a lower potential, and/or a trigger circuit may be connected between G2 210 and G1 240.

An additional NPN 285 may be formed, including collector 235, base 202 and emitter 230. Therefore, the additional NPN 285 shares the emitter 230 with NPN 280, which is part of the SCR. Any current supplied by collector 235 that is injected in collector 230 may help to forward bias the base 202-emitter 230 junction of NPN 280. This additional current injected by collector 235 may help to trigger the SCR. In other words, PNP 270 may need to supply less current to NPN 280 to trigger the SCR, since current may likewise be supplied by NPN 285.

Though not depicted in FIG. 2, any of highly doped regions 210, 220, 230, 235, and 240 may be nested within one or more intervening lower doped regions which are further entirely formed within their respective region 201 or 202. For example, highly doped P region 220 may be formed within a lowly doped P or N region which is formed entirely within lowly doped N region 201. One of ordinary skill should recognize that such intervening regions may be compatible with any embodiments described herein.

As an example implementation of the embodiment of the ESD protection circuit shown in FIG. 2 further including a trigger circuit, the trigger circuit may be, for example, connected between G2 210 and the cathode 230 of the SCR or to any other low potential.

When an ESD event arrives at the anode 220 of the SCR, the trigger circuit may respond by providing a low impedance path between G2 210 and the cathode 240 of the SCR. As such, the internal diode created by the anode 220 of the SCR and the lowly doped N region 201 may be forward biased. This may inject majority carriers into the collector of the PNP 270. The emitter-base junction of the NPN 280 may be forward biased by the majority carriers travelling to region 240. Therefore, a first SCR triggering delay may be introduced by the spacing between the anode 220 and the cathode 230. This spacing may be associated with the base lengths of the PNP 270 and NPN 280. The base transit time, i.e. the time the carriers take to travel through the base of the bipolar transistors, may be cause for a first triggering delay introduced in the SCR. The length of the bases of the bipolar transistors may be minimized to reduce the first triggering delay. Further, the spacing between the anode 220 and the cathode 230 may be free of any other highly doped region. The area between the anode 220 and the cathode 230 may be referred to hereinafter as the area between anode and cathode (AAC).

Bipolar transistors may be minority carrier devices. Therefore, the carriers injected in the collector of the PNP 270 may be holes, and thus may be majority carriers from the perspective of the NPN 280. Therefore, the carriers may not be directly picked up by the cathode 230, but rather through the connection of the collector of the PNP 270, i.e. the G1 trigger gate 240. The voltage built up over the base-emitter junction of the NPN 280 may then cause the cathode 230 to inject electrons (i.e. minority carriers) into the lowly doped P region 202. These carriers may be injected in the collector of the NPN 280 and may travel to the G2 trigger gate 210.

Before the minority carriers may be injected by the cathode 230, the diffusion capacitance of the base 202-emitter 230 junction may need to be charged. Majority carriers may be available to charge this capacitance. The charging of the capacitance, which may be a second cause of a delay in the triggering of the SCR, may be sped up by providing a path for minority carriers to contribute to the charging of the diffusion capacitance. This path may be provided via region 235. When the voltage overshoot increases above the avalanching voltage for the junction between region 235 and the lowly doped P region 202, both minority and majority carriers may be injected in the lowly doped P region 202. The majority carriers may contribute to the voltage biasing of the base-emitter junction of the NPN 280 by increasing the potential as the carriers are picked up by the G1 trigger gate 240. The minority carriers may travel to the collector of the NPN 280, such that a triggering delay of the SCR resulting from the charging of the diffusion capacitance of the base-emitter may be minimized.

The NPN 285 may multiply the minority carriers injected by the collector 235 by a current gain, beta, such that the effect of region 235 may be strengthened by the factor beta.

A third cause for SCR triggering delay in conventional SCR designs may be due to the need to charge the diffusion capacitance of the emitter-base junction of PNP 270, namely, the capacitance between the lowly doped N region 201 and the anode 220, before the SCR can trigger. If a trigger circuit is connected to G2 210, this capacitance may need to be charged before PNP 270 can be triggered and hence trigger the SCR.

This third cause for triggering delay may also be mitigated by the connection of the additional junction 235 to the anode 220 of the SCR as previously described. Due to the connection of region 235 to the anode 220, the voltage difference between region 235 and lowly doped P region 202 may not be delayed by the charging of the diffusion capacitance of the emitter-base junction of PNP 270, such that the avalanching can start without delay. This again may increase the speed of triggering of the SCR.

The aforementioned trigger circuit may remain active during the avalanching of region 235 to lowly doped P region 202. The injection of majority carriers into the lowly doped P region 202 may continue to forward bias the base-emitter junction of NPN 280.

For slower ESD events, faster triggering may be less critical, and as such triggering of the SCR may be less influenced by avalanching associated with region 235. If during triggering of the SCR the voltage overshoot is lower than the voltage required to cause avalanching at the additional region 235, the region 235 may not be active in triggering of the SCR. As such, the disclosed embodiments of the ESD protection circuit described herein may exhibit different triggering behaviors and trigger via different mechanisms in response to slow ESD events vs. fast ESD events.

NPN 285 may be active during and after the triggering of the SCR, which may provide an additional current path to sink ESD current. This may help to increase the current capability of the ESD protection circuit as well as lower the on-resistance. In addition, the voltage difference between region 230 and any node coupled to region 235 may be limited by NPN 235. For instance, if the anode 220 is coupled to a pad, and region 235 is coupled to a supply line that may be different than the pad, the SCR may limit the voltage between pad and ground, while NPN 285 may limit the voltage between the supply and ground. During slow ESD events, the triggering mechanism may not need the additional region 235 to go into avalanching. The trigger circuit may respond to an ESD event by injecting current in a trigger node (e.g. G2 210 or G1 240) of the SCR. For an SCR with a trigger circuit coupled to G2 210, the trigger current may flow from anode 220 through lowly doped N region 201 to the G2 trigger gate 210. As such, the emitter-base junction of PNP 270 may be forward biased, such that PNP 270 may inject current into the collector (i.e. lowly doped P well 202). This current may flow to the G1 trigger gate 240. As this current flows through the intrinsic well resistance 291 and intrinsic well resistance 292, the base 202-emitter 230 junction of the NPN 280 may be forward biased. This, in turn, may trigger NPN 280 to inject current into its collector (i.e. lowly doped N region 201). This current may flow through the intrinsic well resistance 260, helping to forward bias the emitter 220-base 201 junction of the PNP 270 even further. As such, a positive feedback loop may be created and the SCR may be triggered. Note that this mechanism is also present during fast ESD events, with the difference that during fast ESD events, the avalanching of region 235 may help to trigger the SCR in a shorter timeframe.

For an ESD protection device with a trigger circuit coupled to G1 210, the triggering of the ESD protection device during a slow ESD event may be similar. The trigger device may inject current in the G1 210 trigger gate. This current may flow from G1 210 through lowly doped P region 202 to the cathode 230. As such, the base-emitter junction of NPN 280 may be forward biased, such that NPN 280 may inject current into the collector (i.e. lowly doped N well 201). This current may flow to the G2 trigger gate 210. As this current flows through the intrinsic well resistance 260, the emitter 220-base 201 junction of the PNP 270 may be forward biased. This, in turn, may trigger PNP 270 to inject current into its collector (i.e. lowly doped P region 202). This current may flow through the intrinsic well resistance 291 and intrinsic well resistance 292, helping to forward bias the base 202-emitter 230 junction of the NPN 280 even further. As such, a positive feedback loop may be created and the SCR may be triggered. Again, note that this mechanism may also be present during fast ESD events, wherein during fast ESD events, the avalanching of 235 may help to trigger the SCR in a shorter timeframe.

For a trigger device placed between G2 210 and G1 240, the injection of current may happen almost simultaneously in both trigger gates.

The distance between region 235 and the junction formed between the lowly doped P region 202 and lowly doped N region 201 may determine the distance the minority carriers have to travel. The time necessary for the minority carriers to traverse this distance may be referred to as the base transit time. To minimize this distance, no highly doped region other than the cathode 230 may be placed between region 235 and the junction between the lowly doped N region 201 and the lowly doped P region 202.

Figure 3:
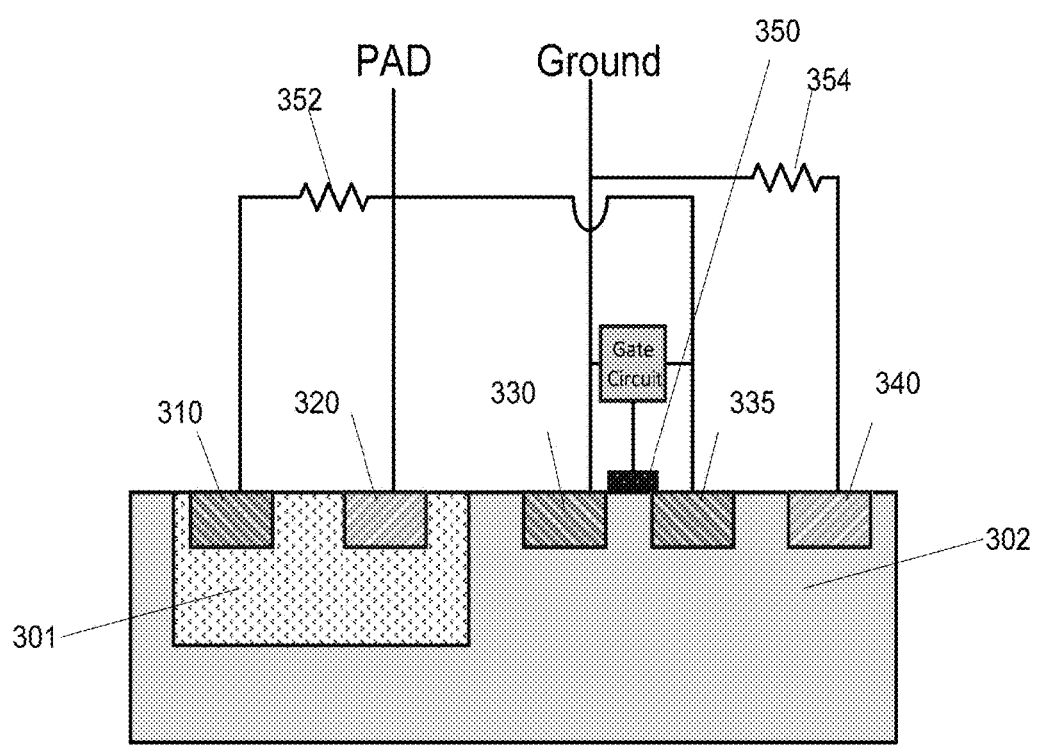
FIG. 3 shows a cross-sectional view of another embodiment of an ESD protection circuit.

As shown in the embodiment of an ESD protection circuit in FIG. 3, a gate 350 may be placed above the area between cathode 330 and region 335. The gate 350 may help to minimize the distance between cathode 330 and region 335, as may be similarly done in MOS devices. For example, during processing, when a gate is placed, the gate mask may determine the distance between cathode 330 and region 335. The gate mask may be more accurate than a mask of an active region. As such, the distance between cathode 330 and region 335 may be more accurately formed than without the use of a gate mask and therefore the distance may be reduced. In another embodiment, a voltage between the gate 350 and cathode 330 might be applied to improve the trigger behavior.

Figure 20A:
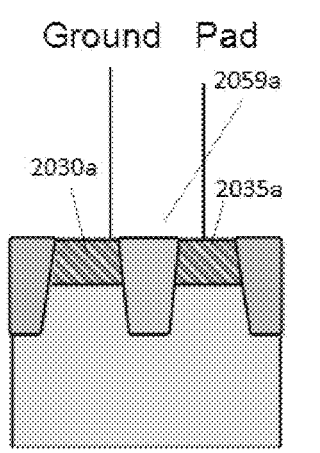
FIGS. 20A, 20B, and 20C, show examples of implementations of the placement or blocking of isolation.
Figure 20B:
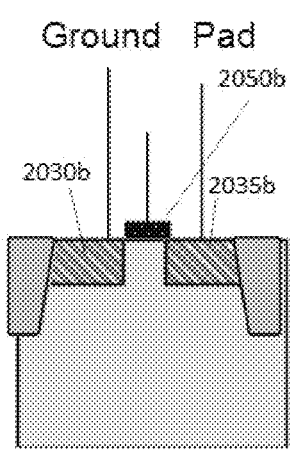
Figure 20C:
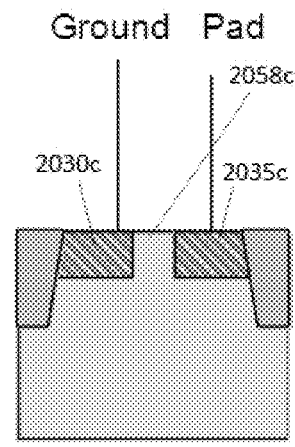
Figure 21A:
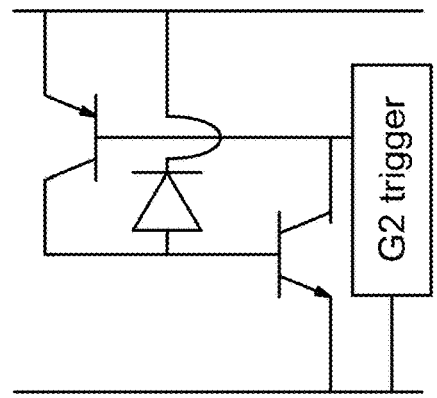
FIGS. 21A, 21B, 21C, and 21D show circuit diagram representations of embodiments of ESD protection circuits with G2 triggering.
Figure 21B:
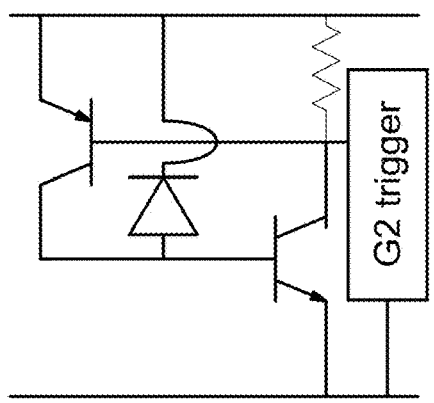
Figure 21C:
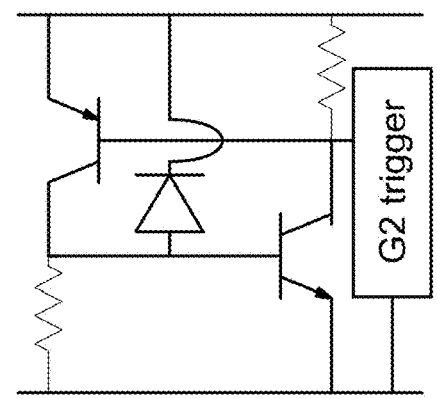
Figure 21D:
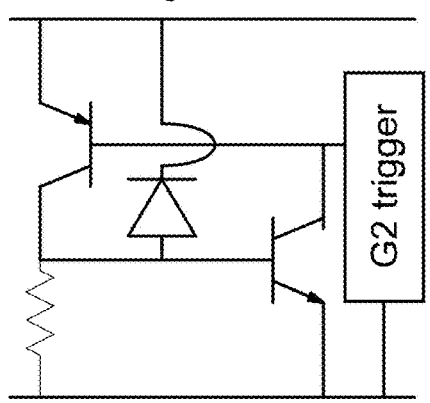

Another use of gate 350 may be to block the isolation (e.g. shallow trench isolation (STI), Deep Trench Isolation (DTI), Field Oxide—or any other isolation offered by the process) between the two regions 330 and 335, such that a direct path between the regions 330 and 335 is possible. This can also be achieved by defining a region active without N or P implant. Examples of isolation, gate depositing, and an active region without N or P implants are shown in FIGS. 20A-20C. FIG. 20A shows isolation 2059a between regions 2030a and 2035a. FIG. 20B shows an example wherein there may be no isolation between regions 2030b and 2035b, as a consequence of placing gate 2050b. In FIG. 20C an active area 2058c without P or N implant is formed, such that no isolation is formed between 2030c and 2035c.

Note that for all cross-sections shown herein, isolation may or may not be used to separate the implant regions.

FIG. 3 depicts an example of spacing between additional region 335 and the junction formed between the lowly doped N region 301 and lowly doped P region 302. Region 335 and region 301 do not overlap. If the additional region 335 overlapped with the junction formed between lowly doped N region 301 and lowly doped P region 302, the minority carriers may not cross the base-collector region of the NPN 380 (not shown) and may therefore be less efficient in mitigating the delay caused by the base-emitter diffusion capacitance. Furthermore, such overlap may cause the anode 320 and cathode 330 to be placed at a larger distance from each other. As noted early, such placement of a highly doped region within the AAC may not be desirable.

FIG. 3 illustrates example connections for the different regions. As shown in FIG. 3, anode 320 and additional region 335 may be connected together, and may be further connected to pad. For example, one or more metal connections may connect anode 320, additional region 335, and the pad. As depicted in FIG. 3, the cathode 330 may be connected to ground. Note that the names 'pad' and 'ground' are only meant as illustrations, and not meant to limit the ESD protection circuit. Alternatively, region 335 may be coupled to region 320 by another circuit element or trigger device, for example a resistor, capacitor, transistor, MOS device, diode, etc. Similarly, regions 320 and 335 may be coupled to the pad via another circuit element or trigger device. Any diodes described herein may be at least one of a Zener diode, a gated diode, a poly diode, a PN junction diode, and a Schottky diode.

Furthermore, the G2 trigger gate 310 may be connected to the anode 320 through a resistive element 352. This resistive element may be an explicitly formed element to provide resistance (e.g. a poly resistor, well resistor, diode, active resistor, transistor, etc.) coupled to the SCR. In one embodiment, the resistor 352 may be a transistor, which can be coupled in high impedance state during triggering and coupled in low impedance state when triggering may be not desired.

Furthermore, the G1 trigger gate 340 may be connected to the cathode 330 through a resistive element 354. This resistive element may be an explicitly formed element to provide resistance (e.g. a poly resistor, well resistor, diode, active resistor, transistor, etc.) coupled to the SCR. In one embodiment, the resistor 354 may be a transistor, which can be coupled in high impedance state during triggering and coupled in low impedance state when triggering may be not desired.

Note that either or both resistive elements 352 and 354 may be included or omitted. Further, either or both of resistive elements 352 and 354 may be a low resistive element or a metal connection.

Note that either or both of resistive elements 352 and 354 may be placed inside or outside the silicon area defined by the boundaries of the SCR.

Figure 4A:
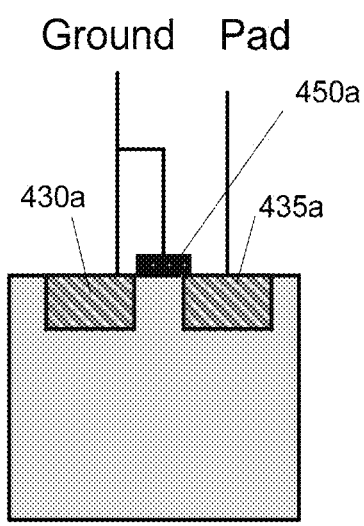
FIGS. 4A, 4B, 4C, and 4D show examples of gate circuits.
Figure 4B:
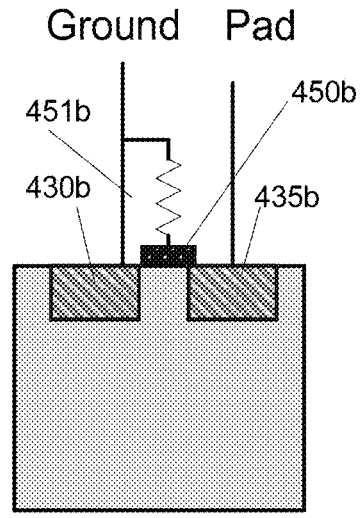
Figure 4C:
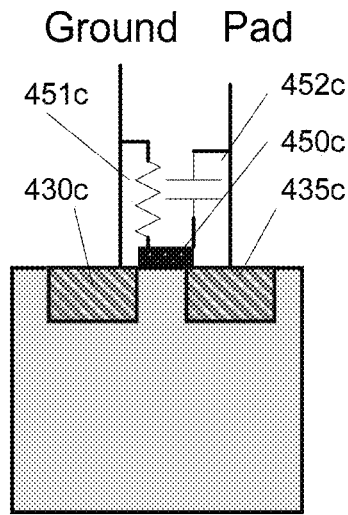
Figure 4D:
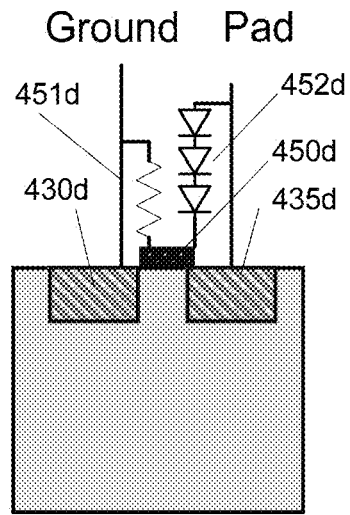

Example embodiments of a gate circuit, such as the gate circuit depicted in FIG. 3, are shown in FIGS. 4A, 4B, 4C, and 4D. As shown in FIG. 4A, gate 450a may be connected to cathode 430a and both may be connected to ground. As shown in FIG. 4B, gate 450b may be coupled, through a resistor 451b, to cathode 430b and to ground. This resistor 451b can be placed to enhance triggering, or to reduce gate leakage. Resistor 451b may reduce gate current flowing from Pad to ground through gate 450b since the resistor 451b would cause a lower leakage current for the same voltage between pad and ground. As shown in FIG. 4C, an additional capacitance 452c may be placed between pad/region 435c and gate 450c to create a time constant approximately determined by the resistance value R of resistor 451c multiplied by the capacitance value C of capacitor 452c during which the voltage of gate 450c may be high and the MOS may be conducting. For a more exact determination of the time constant, the capacitance value of gate 450c may be taken into account. As shown in FIG. 4D, gate 450d may be connected to pad/region 435d through a string of diodes 452d. In this example, the MOS device may turn on at a voltage determined by approximately the amount of diodes in diode chain 452d multiplied by 0.7V. Gate 450d may see the voltage created by the current through the diode chain 452d flowing through the resistor 451d to ground. Note that though three diodes are depicted, any number of diodes may be possible. In general, the gate circuit may include any combination of at least a resistor, transistor, capacitor, inductor, SCR, diode, etc. Note that although connection of the gate circuit is depicted to pad and/or ground, the gate may be connected to other nodes, such as an internal node of the device (e.g. region 310, 320, 330, 335, 340 of FIG. 3 and/or region 1015 of FIG. 10).

Figure 5:
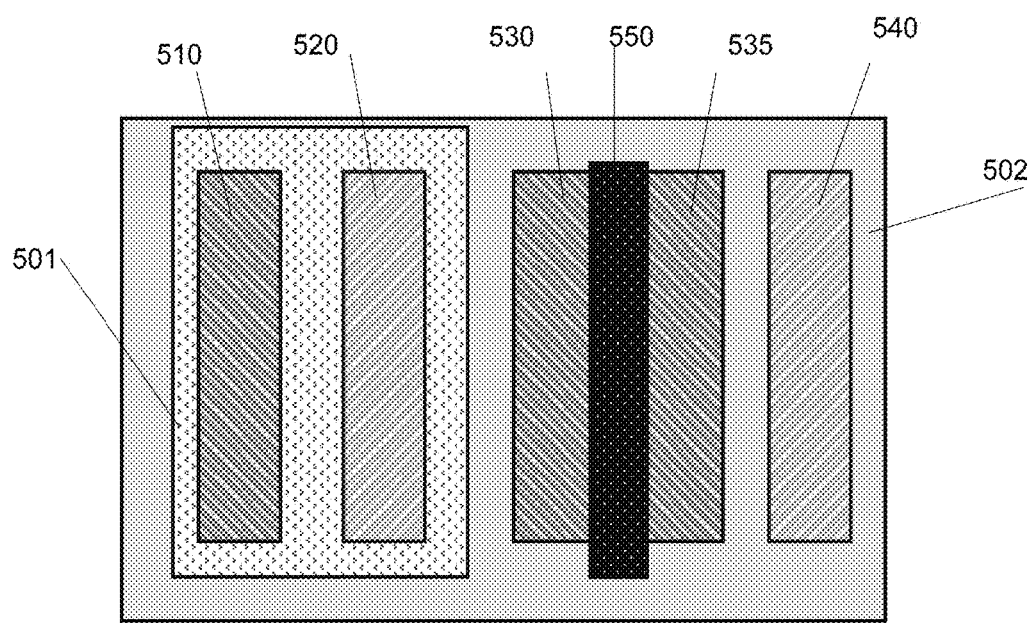
FIG. 5 shows a top view of another embodiment of an ESD protection circuit.

FIG. 5 shows an example of a top view of an embodiment of an ESD protection circuit as described herein. The top view shown in FIG. 5 may correspond to the cross sectional view shown in FIG. 3.

Figure 6:
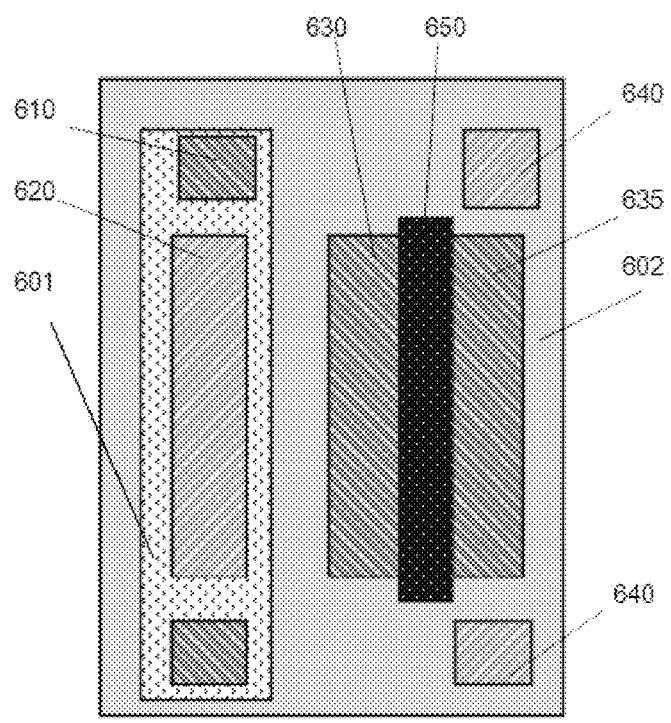
FIG. 6 shows a top view of another embodiment of an ESD protection circuit.

FIG. 6 shows a top view of another embodiment of an ESD protection circuit. As shown in FIG. 6, trigger gates G1

640 and G2 610 may be placed at the top and bottom of the additional region 635 and the anode 620, respectively. Alternatively, one trigger gate may be formed in the style depicted in FIG. 5, and the other trigger gate may be formed in the style depicted in FIG. 6. Although FIG. 6 depicts 2 regions used per trigger gate, more or fewer than 2 may be implemented. Furthermore, the trigger gates may be formed only above the respective regions, only below the respective regions, or one trigger gate may be formed only above its respective region and the other trigger gate may be formed below its respective region.

Figure 7A:
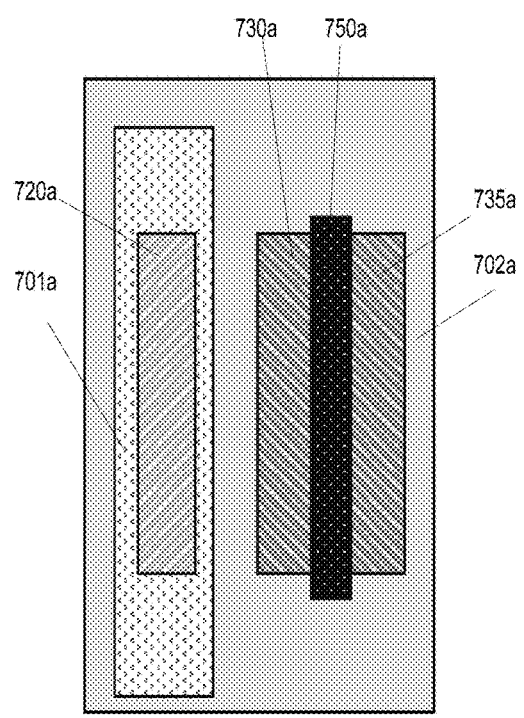
FIGS. 7A and 7B show top views of two further embodiments of an ESD protection circuit.
Figure 7B:
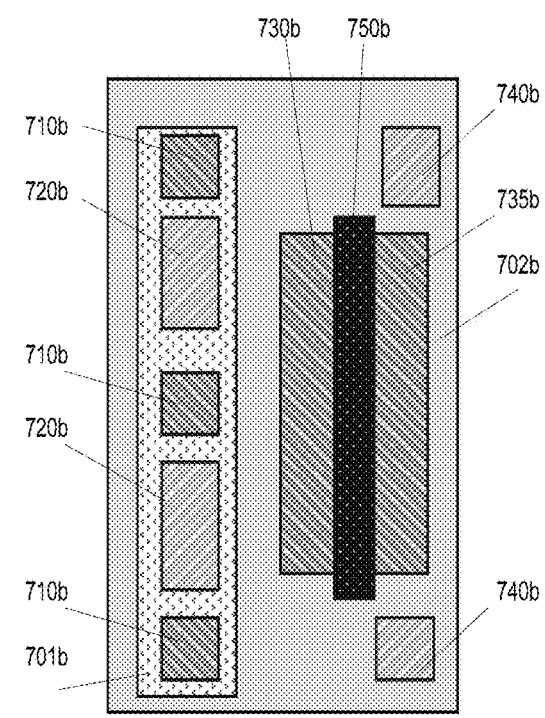

FIGS. 7A and 7B depict two top views of additional embodiments of an ESD protection circuit. As shown in FIG. 7A, both trigger gates G1 and G2 may be omitted. Alternatively, only one of the two trigger gates may be omitted.

As shown in FIG. 7B, trigger gate G2 710b and anode 720b may be interleaved. Although not shown, trigger gate G1 740b and cathode 730b may be interleaved, and/or G1 740b and region 735b may be interleaved. Although FIG. 7B depicts regions 710b and 720b interleaved in a particular order and with a depicted number of individual regions, this should not be limiting to the possible arrangements in accordance with the disclosed embodiments. For example, multiple regions 710b may be next to each other without a region 720b between them, region 720b may be at the top and/or at the bottom, etc. The particular depicted layouts are not meant to be limiting.

Layout styles can also be combined. For example, the layout style depicted in FIG. 7B could be combined with the layout style from FIG. 5 such that a full stripe G2 610 can be added to the layout of FIG. 7B with interleaving G2 710b and anode 720b.

Figures 8A, 8B:
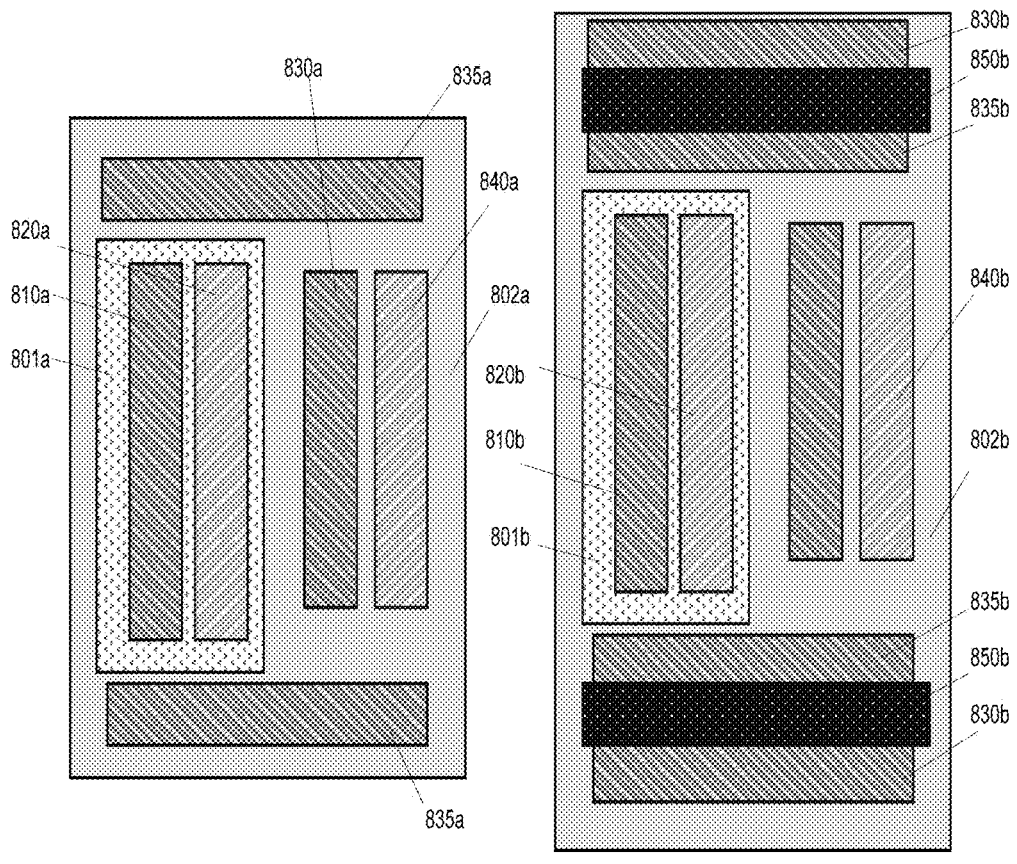
FIGS. 8A and 8B show top views of two further embodiments of an ESD protection circuit.

Another top view of an embodiment of an ESD protection circuit is shown in FIG. 8A. As shown, the region 835a may be placed perpendicular to the region 830a. As shown in FIG. 8B, additional regions 830b may be placed in parallel to the regions 835b, to strengthen the bipolar NPN transistor 285 that be formed by regions 835b, 802b and 830b. In addition, a gate 850b may be disposed above the area between regions 835b and 830b to include a MOS transistor.

Figure 9:
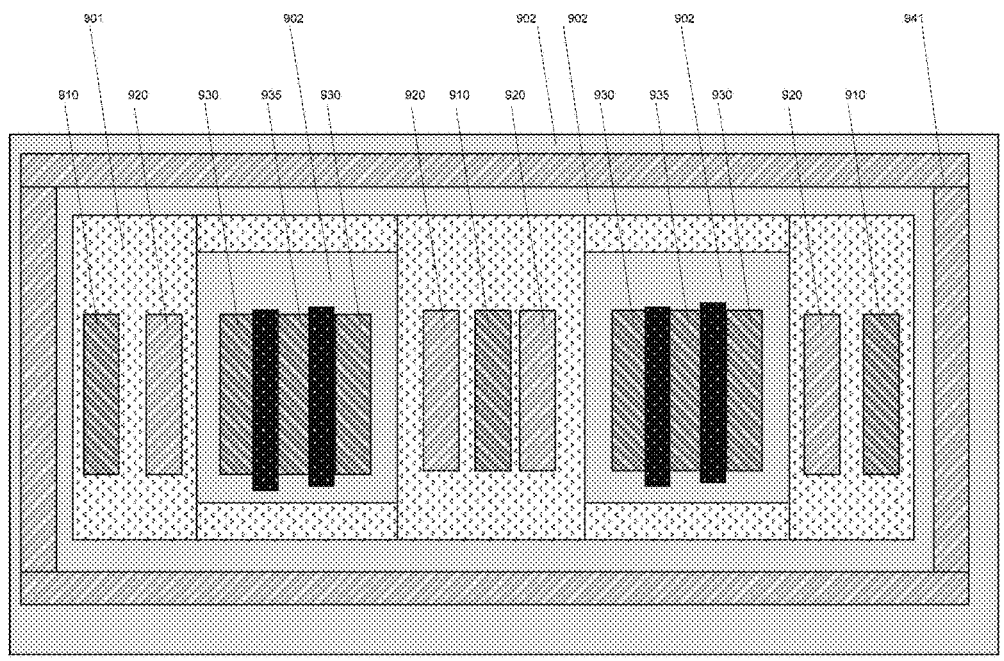
FIG. 9 shows a top view of a multi-finger embodiment of an ESD protection circuit.

Note that any of the embodiments described herein may constitute one finger of a multifinger structure. In a multifinger structure, any junction can be shared over multiple fingers. A top view of an example of a multifinger embodiment of an ESD protection circuit is shown in FIG. 9. FIG. 9 shows a 6 finger structure. As shown in FIG. 9, region 940 may be omitted. This is only done for illustrative purposes. Region 940 may be added to the structure shown in FIG. 9. Region 940 may be omitted to reduce silicon area. A highly doped P guard band 941 may be placed around a silicon device. The guard band 941 may replace region 940 and may serve as a connection to region 902, may serve as a connection to the base of the 6 finger NPN, and may serve as a connection to the collector of the 6 finger PNP of the 6 finger SCR.

The above described embodiments included G2 triggering and the added region 235 resided entirely within the lowly doped P region 202. Additional embodiments will now be described including alternative triggering and/or placement of the added region.

Figure 10:
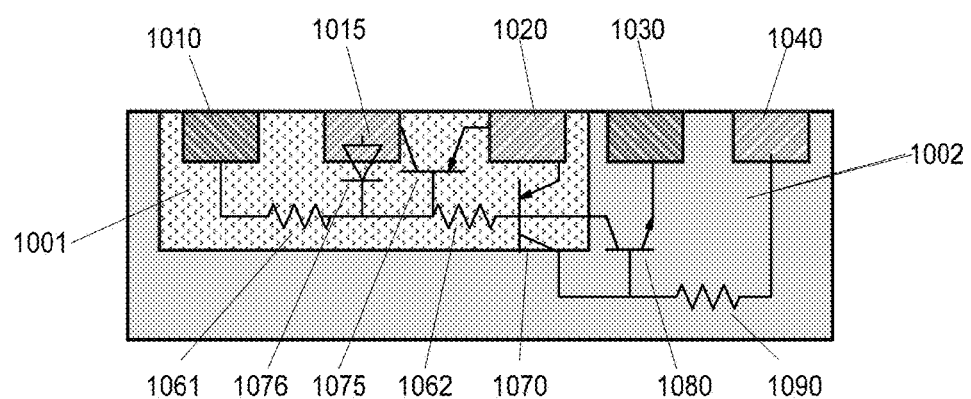
FIG. 10 shows a cross-sectional view of another embodiment of an ESD protection circuit.

In another embodiment of an ESD protection circuit, a triggering device may be coupled between the G1 trigger gate 1040 and a high potential, for example anode 1020 shown in FIG. 10. FIG. 10 further shows additional region 1015 formed entirely within region 1001 such that region 1015 does not overlap with any other region bordering region 1001. The triggering behavior for the embodiment shown in FIG. 10 may be similar to those described above.

FIG. 10 shows a cross-sectional diagram of another embodiment of an ESD protection circuit. As shown in FIG. 10, region 1010 may be a highly doped N region, which may be formed entirely within a lowly doped N region 1001 such that no portion of region 1010 extends into another region bordering region 1001, for example region 1002. Region 1020 may be a highly doped P region, which may be formed entirely within the lowly doped N region 1001 such that no portion of region 1020 extends into another region bordering region 1001. Region 1001 may be formed in a lowly doped P region 1002. The lowly doped P region 1002 may be a P-well or a P substrate. In some processes, the lowly doped P region 1002 may be placed in the lowly doped N region 1001. Regions 1020, 1001, and 1002 may form a PNP bipolar transistor 1070. The base of the PNP 1070 may be connected to the region 1010 through the intrinsic well resistance 1061 and 1062 of region 1001. The collector of the PNP 1070, which may be formed by the region 1002, may be connected via an intrinsic well resistance 1090 of region 1002 to the highly doped P region 1040. The intrinsic well resistance may be alternatively the resistance of the collector. Region 1040 may be formed entirely within the lowly doped P region 1002 such that no portion of region 1040 extends into another region bordering region 1002. Region 1030 may be a highly doped N region, which may be formed entirely within lowly doped P region 1002 such that no portion of region 1030 extends into another region bordering region 1002. Regions 1001, 1002 and 1030 may form an NPN bipolar transistor 1080. The base of the NPN 1080 may be connected to region 1040 through the intrinsic well resistance 1090 of region 1002. The collector of the NPN 1080 may be connected to region 1010 through the intrinsic well resistance 1061 and 1062 of region 1001. Said PNP 1070 and the NPN 1080 may form an SCR. The collector of the PNP 1070 and the base of the NPN 1080 may be commonly formed by region 1002, and the base of the PNP 1070 and the collector of the NPN 1080 may be commonly formed by region 1001.

Region 1010 may be referred to as the G2 trigger gate of the SCR. Region 1020 may be referred to as the anode of the SCR, region 1030 may be referred to as the cathode of the SCR, and region 1040 may be referred to as the G1 trigger gate of the SCR.

FIG. 10 further depicts an additional region 1015. This region 1015 may be a highly doped P region. Region 1015 may be formed entirely within the lowly doped N region 1001 such that no portion of region 1015 extends into another region bordering region 1001. Region 1015 may be connected to a low potential, for example the cathode 1030 of the SCR. Region 1015 may alternatively be the combination of different dopings. For example, region 1015 may comprise a highly doped N region formed in a lowly doped P region, wherein the lowly doped P region may be entirely formed within the lowly doped P region 1002. Though not shown in FIG. 10, a trigger circuit may be connected between G2 1010 and a lower potential (e.g. ground or cathode 1030 of the SCR), a trigger circuit may be connected between G2 and a higher potential (e.g. a supply line, pad, or the anode 1020 of the SCR), a trigger circuit may be connected between a higher potential and G1 1040, a trigger circuit may be connected between G1 1040 and a lower potential, and/or a trigger circuit may be connected between G2 1010 and G1 1040.

An additional PNP 1075 may be formed, including emitter 1020, base 1001, and collector 1015. The PNP 1075 may multiply the minority carriers injected by the collector 1015 by a current gain, beta, such that the effect of region 1015 may be strengthened by the factor beta.

Though not depicted in FIG. 10, any of highly doped regions 1010, 1020, 1030, 1015, and 1040 may be nested within one or more intervening lower doped regions which are further entirely formed within their respective region 1001 or 1002. For example, highly doped P region 1020 may be formed within a lowly doped P or N region which is formed entirely within lowly doped N region 1001. One of ordinary skill should recognize that such intervening regions may be compatible with any embodiments described herein.

As an example implementation of the embodiment of the ESD protection circuit shown in 10 further including a trigger circuit, the trigger circuit may be, for example, connected between G1 1040 and the anode 1020 of the SCR or to any other high potential.

When an ESD event arrives at the anode 1020 of the SCR, the trigger circuit may respond by providing a low impedance path between anode 1020 and G1 1040 of the SCR. As such, the internal diode created by the base 1002 and cathode 1030 of the SCR may be forward biased. This may inject majority carriers into the collector 1001 of the NPN 1080. The emitter-base junction of the PNP 1070 may be forward biased by the majority carriers travelling to region 1010. Therefore, a first SCR triggering delay may be introduced by the spacing between the anode 1020 and the cathode 1030. This spacing may be associated with the base lengths of the PNP 1070 and NPN 1080. The base transit time, i.e. the time the carriers take to travel through the base of the bipolar transistors may be cause for a first triggering delay introduced in the SCR. The length of the base of the bipolar transistors may be minimized to reduce the first triggering delay. Further, the AAC may be free of any other highly doped region.

Bipolar transistors may be minority carrier devices. Therefore, the carriers injected in the collector 1001 of the NPN 1080 may be electrons, and thus may be majority carriers from the perspective of the PNP 1070. Therefore, the carriers may not be directly picked up by the anode 1020, but rather through the connection of the collector 1001 of the NPN 1080 i.e. the G2 trigger gate 1010. The voltage built up over the emitter 1020-base 1001 junction of the PNP 1070 may then cause the anode 1020 to inject holes (i.e. minority carriers) into the lowly doped N region 1001. These carriers may be injected in the collector 1002 of the PNP 1070, and may travel to the G1 trigger gate 1040.

Before the minority carriers may be injected by the anode 1020, the diffusion capacitance of the emitter 1020-base 1001 junction may need to be charged. Majority carriers may be available to charge this capacitance. The charging of the capacitance, which may be a second cause of a delay in the triggering of the SCR, may be sped up by providing a path for minority carriers to contribute to the charging of the diffusion capacitance. This path may be provided via region 1015. When the voltage overshoot increases above the avalanching voltage for the junction between region 1015 and the lowly doped N region 1001, both minority and majority carriers may be injected in the lowly doped N region 1001. The majority carriers may contribute to the voltage biasing of the emitter-base junction of the PNP 1070 by decreasing the potential as the carriers are picked up by the G2 trigger gate 1010. The minority carriers arising from the avalanching of the junction between region 1001 and region 1015 may travel to the emitter 1020 of the PNP 1070, such that a triggering delay of the SCR resulting from the charging of the diffusion capacitance of the emitter-base junction may be minimized.

A third cause for SCR triggering delay in conventional SCR designs may be due to the need to charge the diffusion capacitance of the base-emitter junction of NPN 1080, namely, the capacitance between the cathode 1030 and the lowly doped P region 1002, before the SCR can trigger. If a trigger circuit is connected to G1 1040, this capacitance may need to be charged before NPN 1080 can be triggered and hence trigger the SCR.

This delay may also be mitigated by the connection of the additional junction 1015 to the cathode 1030 of the SCR. The voltage over the lowly doped N region 1010 to the additional region 1015 is not delayed by the charging of the diffusion capacitance of the base-emitter junction of the NPN 1080, such that the avalanching can start without delay. This again increases the speed of triggering of the SCR.

This third cause for triggering delay may also be mitigated by the connection of the additional junction 1015 to the cathode 1030 of the SCR as previously described. Due to the connection of region 1015 to the cathode 1030, the voltage difference between region 1015 and lowly doped N region 1001 may not be delayed by the charging of the diffusion capacitance of the base-emitter junction of NPN 1080, such that the avalanching can start without delay. This again increases the speed of triggering of the SCR.

The aforementioned trigger circuit may remain active during the avalanching of region 1015 to lowly doped N region 1001. The injection of majority carriers into the lowly doped N region 1001 may continue to forward bias the emitter-base junction of PNP 1070.

For slower ESD events, faster triggering may be less critical, and as such triggering of the SCR may be less influenced by avalanching associated with region 1015. If during triggering of the SCR the voltage overshoot is lower than the voltage required to cause avalanching at the additional region 1015, the region 1015 may not be active in triggering of the SCR. As such, the disclosed embodiments of the ESD protection circuit described herein may exhibit different triggering behaviors and trigger via different mechanisms in response to slow ESD events vs. fast ESD events.

PNP 1075 may be active during and after the triggering of the SCR, which may provide an additional current path to sink ESD current. This may help to increase the current capability of the ESD protection circuit as well as lower the on-resistance. In addition, the voltage difference between region 1020 and any node coupled to region 1015 may be limited by PNP 1075. For instance, if the anode 1020 is coupled to a pad, cathode 1030 is coupled to a first ground, and region 1015 is coupled to a second ground that may be different than the first ground, the SCR may limit the voltage between pad and first ground, while PNP 1075 may limit the voltage between the pad and the second ground.

The distance between region 1015 and the junction formed between the lowly doped P region 1002 and lowly doped N region 1001 may determine the distance the minority carriers have to travel. To minimize this distance, no highly doped region other than the anode 1020 may be placed between region 1015 and the junction between the lowly doped N region 1001 and the lowly doped P region 1002.

Figure 11:
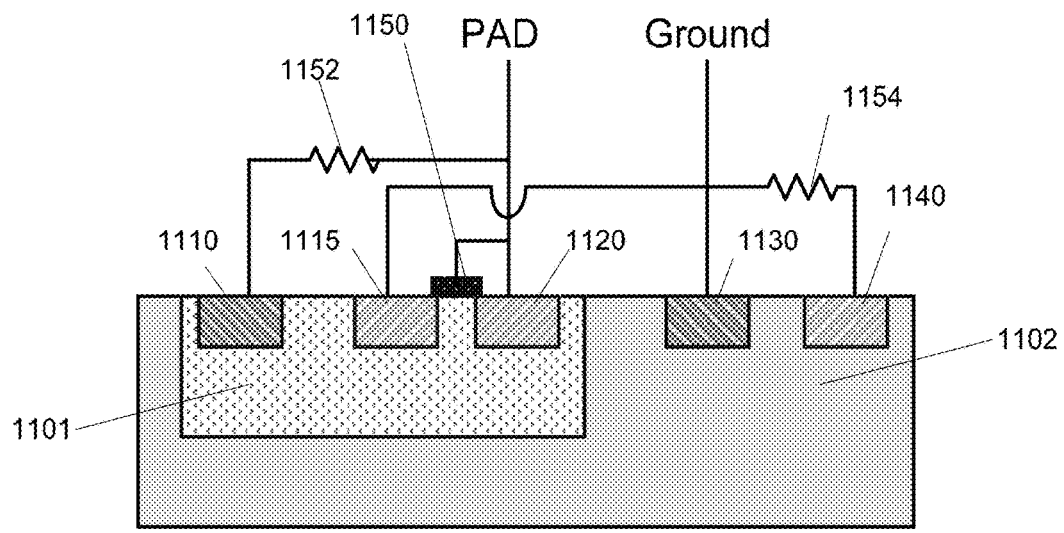
FIG. 11 shows a cross-sectional view of another embodiment of an ESD protection circuit.

FIG. 11 depicts an example embodiment of an ESD protection circuit including a gate 1150 placed above the area between anode 1120 and region 1115. The gate 1150 may help to minimize the distance between regions 1120 and 1115, as may be similarly done in MOS devices. For example, during processing, when a gate is placed the gate mask may determine the distance between anode 1120 and region 1115. The gate mask may be more accurate than a mask of an active region. As such, the distance between anode 1120 and region 1115 may be more accurately formed than without the use of a gate mask and therefore the distance may be reduced. In another embodiment, a voltage between the gate 1150 and anode 1120 might be applied to improve the trigger behavior.

Gate 1150 may be used to block isolation (e.g. STI, DTI, Field Oxide—or any other isolation offered by the process) between the two regions 1015 and 1020, such that a direct path between the regions 1015 and 1020 is possible. This can also be achieved by defining a region active without N or P implant. We again refer to FIG. 20A-20C for examples of implementations of the placement or blocking of isolation.

FIG. 11 depicts an example of spacing between additional region 1115 and the junction formed between the lowly doped N region 1101 and lowly doped P region 1102. Regions 1115 and 1102 do not overlap. If the additional region 1115 overlapped with the junction formed between lowly doped N region 1101 and lowly doped P region 1102, the minority carriers may not cross the base-collector region of the PNP 1170 (not shown) and may therefore be less efficient in mitigating the delay caused by the base-emitter diffusion capacitance. Furthermore, such overlap may cause the anode 1120 and cathode 1130 to be placed at a larger distance from each other. As noted early, such placement of a highly doped region within the AAC may not be desirable.

FIG. 11 illustrates example connections for the different regions. As shown in FIG. 11, additional region 1115 and cathode 1130 may be connected together and may be further connected to ground. For example, one or more metal connections may connect additional region 1115, cathode 1130, and ground. As depicted in FIG. 11, the anode 1120 may be connected to pad. Alternatively, region 1115 may be coupled to region 1130 by another circuit element or trigger device, for example a resistor, capacitor, transistor, MOS device, diode, etc. Similarly, regions 1130 and 1115 may be coupled to ground via another circuit element or trigger device.

Furthermore, the G2 trigger gate 1110 may be connected to the anode 1120 through a resistive element 1152. This resistive element may be an explicitly formed element to provide resistance (e.g. a poly resistor, well resistor, diode, active resistor, transistor, etc.) coupled to the SCR. In one embodiment, the resistor 1152 may be a transistor, which can be coupled in high impedance state during triggering and coupled in low impedance state when triggering may be not desired.

Furthermore, the G1 trigger gate 1140 may be connected to the cathode 1130 through a resistive element 1154. This resistive element may be an explicitly formed element to provide resistance (e.g. a poly resistor, well resistor, diode, active resistor, transistor, etc.) coupled to the SCR. In one embodiment, the resistor 1154 may be a transistor, which can be coupled in high impedance state during triggering and coupled in low impedance state when triggering may be not desired.

Note that either or both resistive elements 1152 and 1154 may be included or omitted. Further, either or both of resistive elements 1152 and 1154 may be a low resistive element or a metal connection.

Note that either or both of resistive elements 1152 and 1154 may be placed inside or outside the silicon area defined by the boundaries of the SCR.

Figure 12:
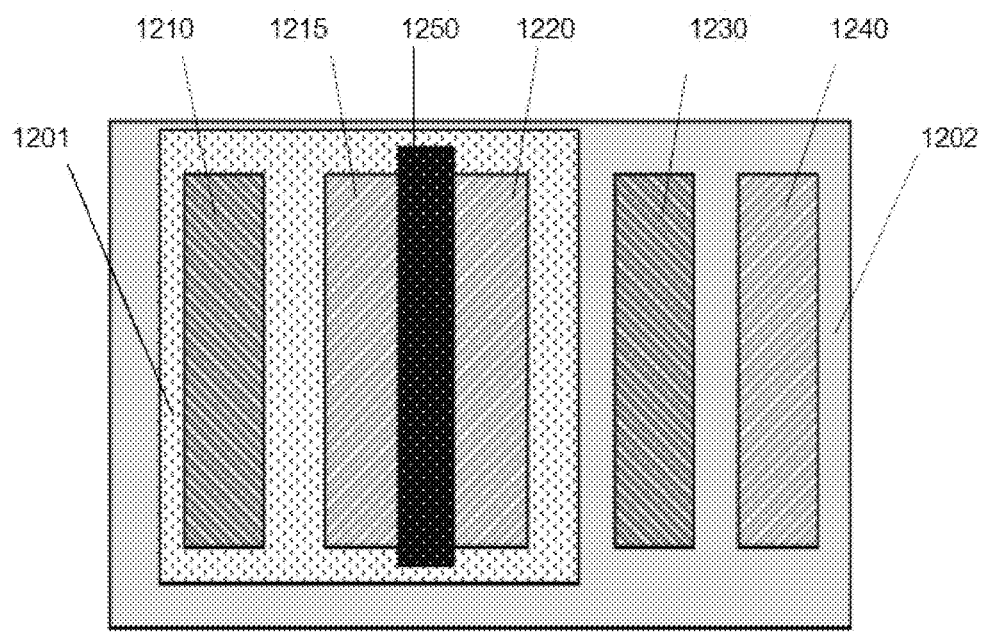
FIG. 12 shows a top view of another embodiment of an ESD protection circuit.

FIG. 12 shows an example of a top view of an embodiment of an ESD protection circuit. The top view shown in FIG. 12 may correspond to the cross sectional view shown in FIG. 11. Furthermore, additional region 1215, G2 1210, anode 1220, cathode 1230, and G1 1240 may be arranged as similarly illustrated by way of example in FIGS. 6-8. Further, the layout shown FIG. 12 may be expanded into a multifinger arrangement such as that similarly depicted in FIG. 9.

Figure 13:
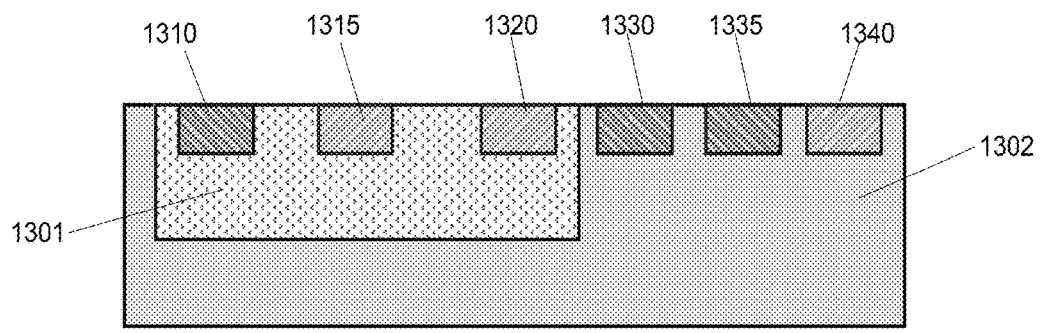
FIG. 13 shows a cross-sectional view of another embodiment of an ESD protection circuit.

FIG. 13 shows an example of a cross-sectional view of an embodiment of an ESD protection circuit including both a first additional region 1315 and a second additional region 1335. This embodiment may combine the teachings of any of the other embodiments described herein and is provided as an example of an embodiment combining teachings of the embodiment shown in FIG. 2 and the embodiment shown in FIG. 10. Though not depicted in FIG. 13, an additional PNP transistor 1375 including collector 1315, base 1301, and emitter 1320 may be formed and an additional NPN transistor 1385 including emitter 1335, base 1302, and emitter 1330 may be formed. External circuitry as described in other embodiments disclosed herein may be further connected. For example, trigger circuits and explicit, external resistors may be combined with the embodiment of FIG. 13 to trigger the ESD protection device.

Heretofore, it has been assumed that the embodiments of an ESD protection circuit described herein have had a trigger circuit coupled to G2 with the additional region in the lowly doped P region, or have had a trigger circuit coupled to G1 with the additional region in the lowly doped N region. Additional embodiments will now be described including G2 triggering with the additional region in the lowly doped N region, and G1 triggering with the additional region in the lowly doped P region.

We will refer to the layout shown in FIG. 2 and provide an example of G1 triggering with the additional region 235 in the lowly doped P region 202 as shown in FIG. 2.

When an ESD event arrives at the anode 220 of the SCR, the trigger circuit may respond by providing a low impedance path between anode 220 and G1 240 of the SCR. As such, the internal diode created by the lowly doped P region 202 and the cathode 230 may be forward biased. This may inject majority carriers into the collector of the NPN 280. The emitter-base junction of the PNP 270 may be forward biased by the majority carriers travelling to region 210. Therefore, a first SCR triggering delay may be introduced by the spacing between the anode 220 and cathode 230. This spacing may be associated with the base lengths of the PNP 270 and NPN 280. The base transit time, i.e. the time the carriers take to travel through the base of the bipolar transistors, may be cause for a first triggering delay introduced in the SCR. The length of the bases of the bipolar transistors may be minimized to reduce the first triggering delay. Further, the AAC may be free of any other highly doped region.

The charging of the diffusion capacitance between the lowly doped P region 202 and cathode 230 may be a second cause for SCR triggering delay. During this delay a voltage overshoot may cause the junction between the additional region 235 and the lowly doped P region 202 to go into avalanching. This may generate majority and minority carriers. The minority carriers may help the diffusion capacitance to be charged more quickly, while the majority carriers may be swept to region 1040, further forward biasing the base-emitter junction. This mechanism may speed up triggering of the SCR.

A third cause for SCR triggering delay in conventional SCR designs may be due to the need to charge the diffusion capacitance of the emitter-base junction of PNP 270, namely, the capacitance between the lowly doped N region 201 and the anode 220. By coupling the additional region 235 to the anode 220, the voltage over the junction formed between the additional region 235 and the lowly doped P region 202 may not be delayed by the charging of the diffusion capacitance. Therefore, the influence of this delay on the triggering speed of the SCR may be lessened.

We will now refer to the layout shown in FIG. 10 and provide an example of G2 triggering with the additional region 1015 in the lowly doped N region 1001 as shown in FIG. 10.

When an ESD event arrives at the anode 1020 of the SCR, the trigger circuit may respond by providing a low impedance path between G2 1010 and the cathode 1040 of the SCR. As such, the internal diode created by the anode 1020 of the SCR and the lowly doped N region 1001 may be forward biased. This may inject majority carriers into the collector of the PNP 1070. The base 1002-emitter 1030 junction of the NPN 1080 may be forward biased by the majority carriers travelling to region 1040. Therefore, a first SCR triggering delay may be introduced by the spacing between the anode 1020 and the cathode 1030. This spacing may be associated with the base lengths of the PNP 1070 and NPN 1080. The base transit time, i.e. the time the carriers take to travel through the base of the bipolar transistors, may be a first cause for a triggering delay introduced in the SCR. The length of the bases of the bipolar transistors may be minimized to reduce the triggering delay. Further, the AAC may be free of any other highly doped region.

The charging of the diffusion capacitance between the anode 1020 and the lowly doped N region 1001 may be a second cause for SCR triggering delay. During this delay a voltage overshoot may cause the junction formed between the lowly doped N region 1001 and the additional junction 1015 to go into avalanching. This may generate majority and minority carriers. The minority carriers may help the diffusion capacitance to be charged more quickly, while the majority carriers may be swept to region 1040, further forward biasing the emitter-base junction. This mechanism may speed up triggering of the SCR.

The charging of the diffusion capacitance between lowly doped P region 1002 and cathode 1020 may be a third cause for SCR triggering delay. By coupling the additional region 1015 to the cathode 1030, the voltage over the junction between the additional region 1015 and the lowly doped N region 1001 may not be delayed by the charging of the diffusion capacitance. Therefore, the influence of this delay on the triggering speed of the SCR may be lessened.

The embodiment of FIG. 2 may be alternatively described as a way of strengthening NPN 285 for longer ESD events by reducing the time that the junction between collector 235 and base 202 sustain avalanching.

Referring to FIG. 2, NPN 285 may include collector 235, base 202, and emitter 230. The base 202 of NPN 285 may be coupled to region 240 through the intrinsic well resistance 292. The collector of PNP 270 may also be coupled to region 240 through the intrinsic well resistance 291+292.

When the NPN 285 reacts to a fast ESD event, avalanching in the junction between collector 235 and base 202 may occur. This avalanching may create significant heat. As such, the amount of time before destructive thermal runaway occurs may be limited. The time may also be dependent on the amount of current density. The NPN may be susceptible to damage during Electrical overstress (EOS), which may have much longer time duration than ESD. Furthermore, the amount of current through the junction without causing damage may be limited. In mature to advanced technologies, the current may be limited typically to 5-10 mA per um width of the collector 235 region. As such, an SCR, such as that formed by PNP 270 and NPN 280, may help boost and sustain current sinking.

An SCR formed by PNP 270 and NPN 280 may be placed close to the bipolar 285, wherein the NPN 280 shares an emitter 230 with NPN 285. NPN 280 may include collector 201, base 202 and emitter 230, while the PNP 270 may include emitter 220, base 201, and collector 202. The base 202 of NPN 280 may be coupled to region 240 through the intrinsic well resistance 291 and intrinsic well resistance 292. The collector of PNP 270 may also be coupled to region 240 through the intrinsic well resistance 291 and intrinsic well resistance 292.

When an ESD event reaches the ESD protection circuit, the junction between collector 235 and base 202 may go into avalanching. The carriers created may forward bias the base 202-emitter 230 diode, turning on NPN 285. Shortly thereafter, NPN 280 may trigger as well. This turn-on of NPN 280 may be slightly slower than the turn-on of 285 because after forward biasing the base-emitter junction, the carriers may still travel to the collector 201 of NPN 280. These carriers may travel to region 210 through the intrinsic well resistance 260, forward biasing the emitter 220-base 201 junction of PNP 270, which may turn on PNP 270. When sufficient current flows through PNP 270 and NPN 280 such that the product of their current gains is greater than 1 ($beta_{PNP} \times beta_{NPN} > 1$), positive feedback may be established, and the SCR may be triggered.

Once the SCR is triggered, typically no more avalanching may be required between the junction between collector 235 and base 202, such that less heat may be generated. This reduction in heat generation may result in higher current density before damage occurs, and/or in the ability to sustain longer pulse durations before damage occurs.

A trigger circuit may be coupled to G1 trigger tap 240, G2 trigger tap 210, or both, such that a trigger voltage can be determined to trigger the SCR during slow ESD events before avalanching of collector 235 and base 202 of NPN 285 occurs. A finely tuned trigger voltage may be advantageous to protect against slower ESD events. For fast ESD events, the nodes to be protected may typically be able to sustain higher voltages, as the time duration is shortened. However, for slower ESD events the node to be protected might be damaged without appropriate triggering. Without a trigger circuit to trigger at a tuned triggering voltage, damage within the device may be possible when very long and low current pulses are applied. For instance, it is known that human body model (HBM) testers may inject a small current (uA to mA) for a longer time duration (us to ms). This charges up the devices to the point of avalanching, though not enough current is supplied to trigger the SCR. Due to the long time duration, this may damage the NPN 285. Damage may be avoided by connecting a trigger circuit to G1 trigger tap 240, G2 trigger tap 210, or both, wherein the trigger circuit is tuned to trigger the SCR during slow ESD events before avalanching of collector 235 and base 202 of NPN 285 occurs.

Figure 14:
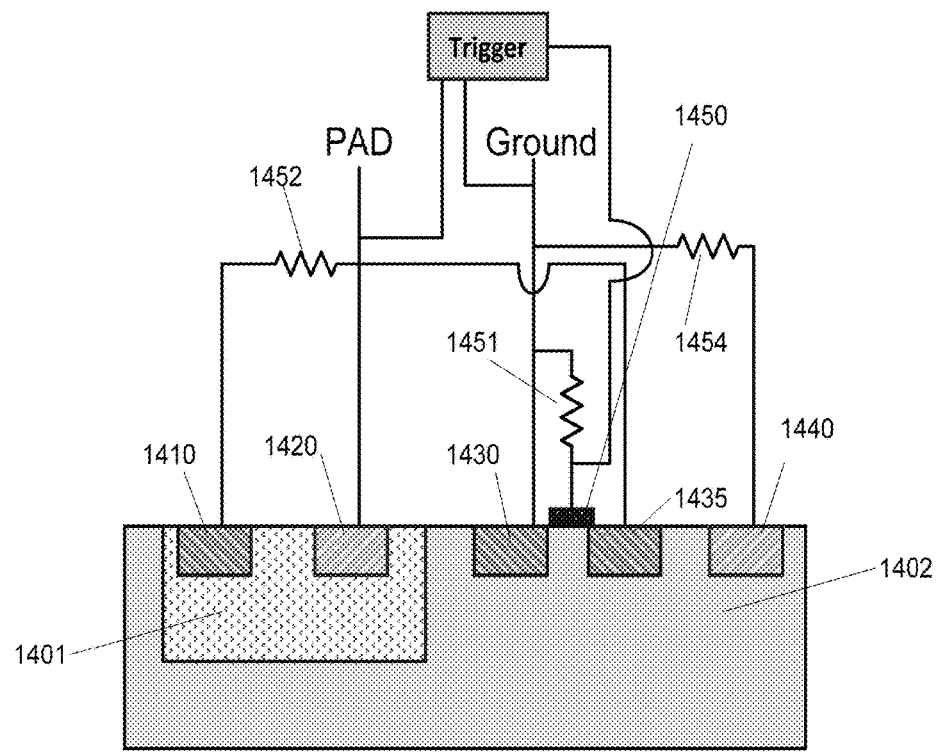
FIG. 14 shows a cross-sectional view of another embodiment of an ESD protection circuit including a trigger circuit.

As shown in FIG. 3, a gate 350 may be disposed between collector 335 and emitter 330 creating a MOS device. In that case collector 335 is typically referred to as the drain and emitter 330 is typically referred to as the source. Gate 350 can be helpful to decrease the distance between source 330 and drain 335, as during processing this distance may be determined by the minimum dimensions of the gate mask, rather than the mask that defines the active area. Typically, the gate mask may have the highest accuracy, and therefore using a gate, smaller distances can be obtained. The created MOS device can be used in active MOS mode as well. A gate circuit can be connected such that during the ESD event MOS current can flow. A trigger circuit may be connected to the gate 350 of the MOS device such as that shown by way of example in FIG. 14. A trigger circuit may be additionally or alternatively coupled to pad, anode 1420, ground, and/or cathode 1430. An explicit, external resistive element 1452 may couple G2 1410 to pad, anode 1420, trigger circuit, and/or additional region 1435. The trigger circuit may be additionally or alternatively coupled to the anode 1420. An explicit resistive element 1454 may additionally couple G1 1440 to cathode 1430 and/or ground. The trigger may be additionally coupled to the gate 1450 via an explicit resistive element 1451.

Figure 15:
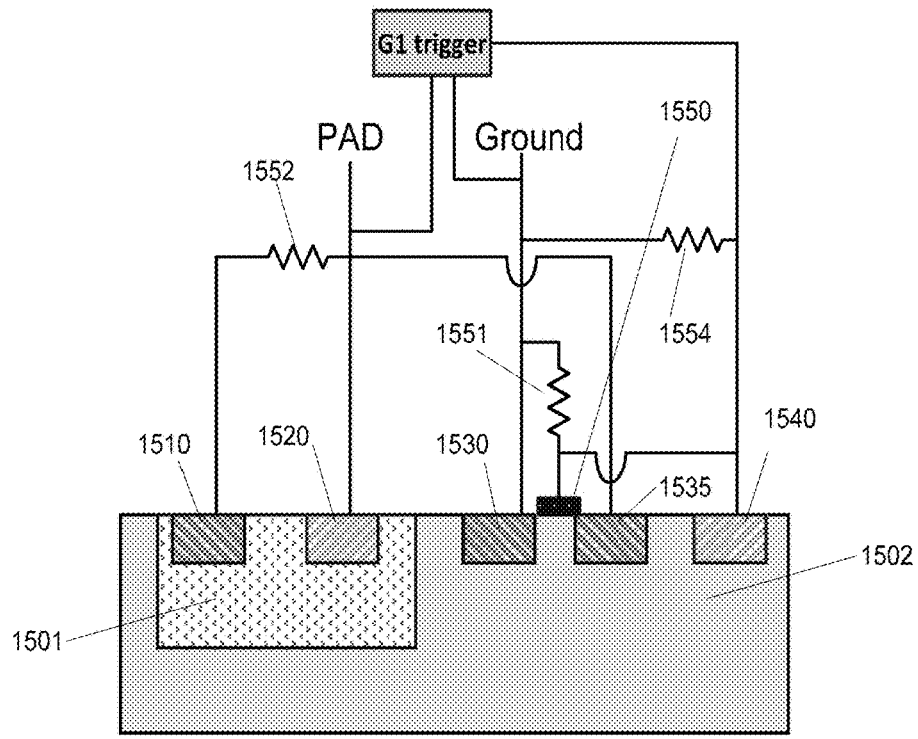
FIG. 15 shows a cross-sectional view of another embodiment of an ESD protection circuit including a trigger circuit.

As shown in FIG. 15, in another embodiment of an ESD protection circuit, a trigger circuit may be applied to G1 trigger gate 1540 and/or to the gate 1550.

Figure 16:
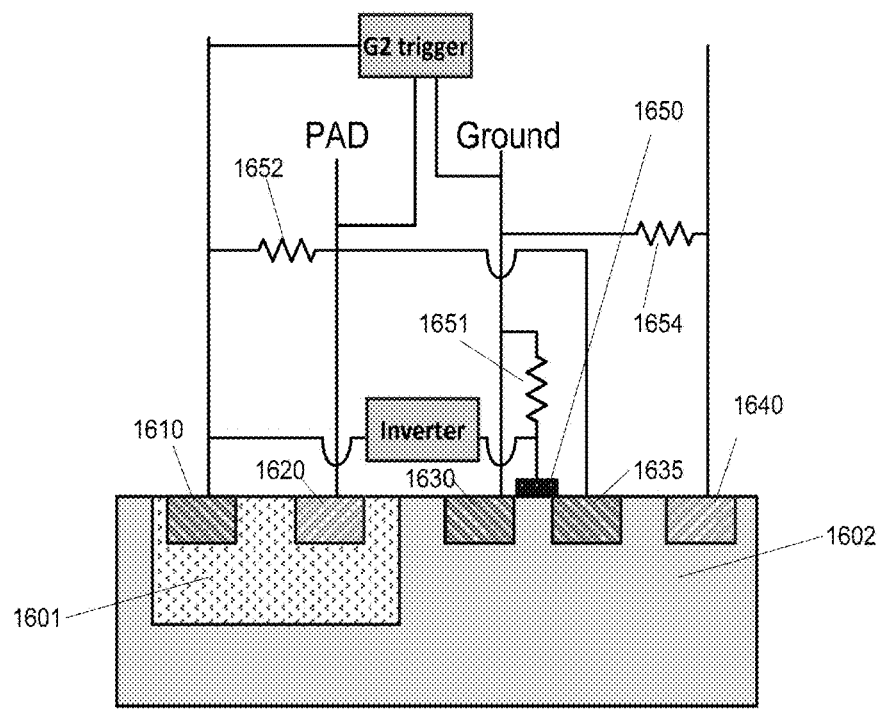
FIG. 16 shows a cross-sectional view of another embodiment of an ESD protection circuit including a trigger circuit.

As shown in FIG. 16, a trigger circuit may be additionally coupled to the G2 1610. An inverter may be further coupled between gate 1650 and G2 1610.

Figure 17:
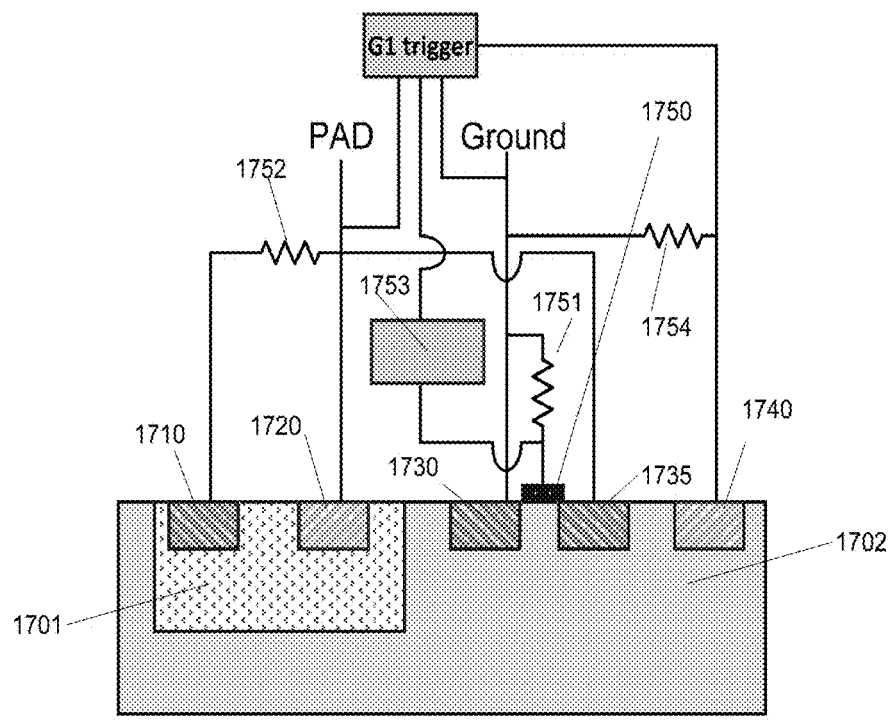
FIG. 17 shows a cross-sectional view of another embodiment of an ESD protection circuit including a trigger circuit.

As included in the embodiment of an ESD protection circuit shown in FIG. 17, gate 1750 may be directly coupled to any point within the trigger circuit, or may be coupled to the trigger circuit via additional element 1753. Additional element 1753 may be any combination of one or more forward or reverse diode, transistor, resistor, inductor, capacitance, etc. In one example, the element 1753 may include a reverse diode to increase the total voltage required before the junction between region 1735 and region 1702 goes into avalanching.

Figure 18:
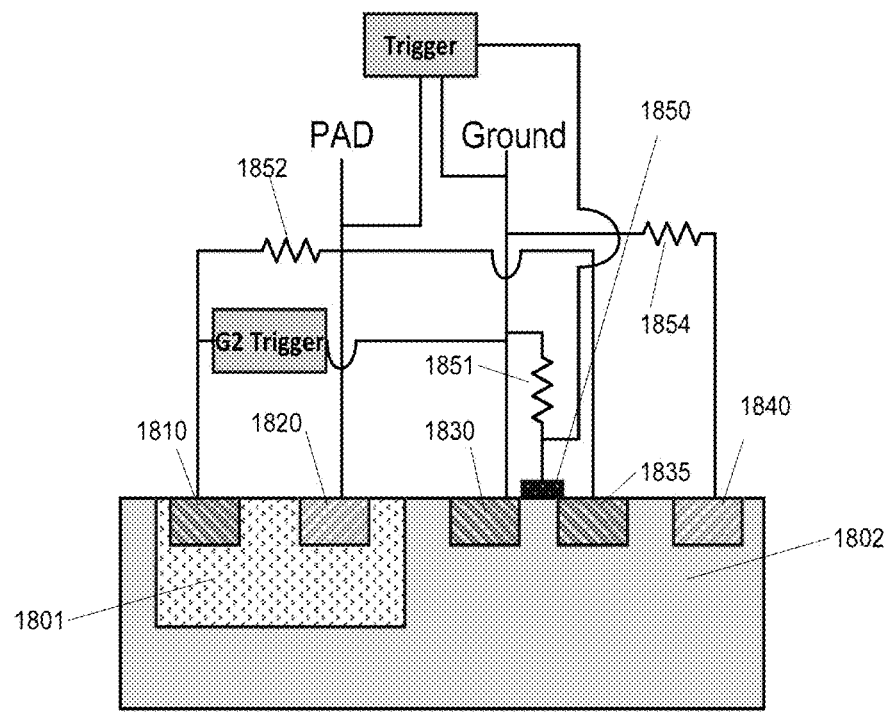
FIG. 18 shows a cross-sectional view of another embodiment of an ESD protection circuit including a trigger circuit.

In another embodiment, as shown in FIG. 18, multiple trigger circuits may be coupled to the ESD protection circuit. For example, a first trigger circuit may be coupled to the G2 trigger gate 1810 of the SCR and a second trigger circuit may be coupled to the gate 350 of the MOS device. As shown in FIG. 18, a trigger circuit may be coupled to G2 1810, though it is likewise possible to couple the trigger circuit between a high potential, such as pad, and G1 1840.

Note that though bipolar 285 is shown as a one finger device, it is possible that this is part of a multifinger bipolar. Likewise, when gate 350 is deposited, regions 330, 350, and 335 may be one finger of a multifinger MOS device. In general, any number of fingers of the SCR can be combined with any number of bipolar or MOS fingers.

The embodiment of FIG. 10 may be regarded as a way of strengthening PNP bipolar 1075 for longer ESD events, by reducing the time that the junction between base 1001 and collector 1015 needs to sustain avalanching.

Referring to FIG. 10, PNP 1075 may include collector 1015, base 1001 and emitter 1020. The base 1001 of PNP 1075 may be coupled to region 1010 through the intrinsic well resistance 1061. The base of PNP 1070 is coupled to region 1010 through the intrinsic well resistance 1061 and intrinsic well resistance 1062.

When the PNP 1015 reacts to a fast ESD event, avalanching in the junction between base 1001 and collector 1015 may occur. This avalanching may create significant heat. As such, the amount of time before destructive thermal runaway occurs may be limited. The time may also be dependent on the amount of current density. This might make the PNP 1075 susceptible to damage during Electrical overstress (EOS), which may have a much longer time duration than ESD. Furthermore, the amount of current through the junction without causing damage may be limited. In mature to advanced technologies, the current may be limited typically to 5-10 mA per um width of the collector 1015 region. As such, an SCR, such as that formed by PNP 270 and NPN 280, may help boost and sustain current sinking.

An SCR formed by PNP 1070 and NPN 1080 may be placed close to the bipolar 1075, wherein the PNP 1070 may share an emitter 1020 with PNP 1075. NPN 1080 may include collector 1001, base 1002, and emitter 1030, while the PNP 1070 may include emitter 1020, base 1001, and collector 1002. The base 1002 of NPN 1080 may be coupled to region 1040 through the intrinsic well resistance 1090. The collector of PNP 1070 may be also coupled to region 1040 through the intrinsic well resistance 1090.

When an ESD event reaches the ESD protection circuit, the junction between base 1001 and collector 1015 may go into avalanching. The carriers created may forward bias the emitter 1020-base 1001 diode, turning on PNP 1075. Shortly thereafter, PNP 1070 may trigger as well. This turn-on of PNP 1070 may be slightly slower than the turn-on of PNP 1075 because after forward biasing the emitter-base junction, the carriers may still travel to the collector 1002 of PNP 1070. These carriers may travel to region 1040 through the intrinsic well resistance 1090, forward biasing the base 1002-emitter 1030 junction of NPN 1080, which may turn on NPN 1080. When sufficient current flows through PNP 1070 and NPN 1080 such that the product of their current gains is greater than 1 ($beta_{PNP} \times beta_{NPN} > 1$), positive feedback may be established, and the SCR may be triggered.

When the SCR is triggered, typically no more avalanching may be required between the junction between collector 1015 and base 1001, such that less heat may be generated. This reduction in heat generation may result in a higher current density before damage occurs, and/or in the ability to sustain longer pulse durations before damage occurs.

A trigger device may be coupled to G1 trigger tap 1040, G2 trigger tap 1010 or both, such that a trigger voltage can be determined to trigger the SCR during slow ESD events before avalanching of collector 1015 and base 1001 of PNP 1075 may occur. A finely tuned trigger voltage may be advantageous to protect against slower ESD events. For fast ESD events, the nodes to be protected may typically be able to sustain higher voltages, as the time duration is shortened. However, for slower ESD events the node to be protected might be damaged without appropriate triggering. Without a triggering circuit to trigger at a tuned triggering voltage, damage within the device may be possible when very long and low current pulses are applied. For instance, it is known that HBM testers may inject a small current (uA to mA) for a longer time duration (us to ms). This charges up the devices to the point of avalanching, though not enough current is supplied to trigger the SCR. Due to the long time duration, this may damage the bipolar 1075. Damage may be avoided by connecting a trigger circuit to G1 trigger tap 1040, G2 trigger tap 1010, or both, wherein the trigger circuit may be tuned to trigger the SCR during slow ESD events before avalanching of collector 1015 and base 1001 of PNP 1075 occurs.

Figure 19:
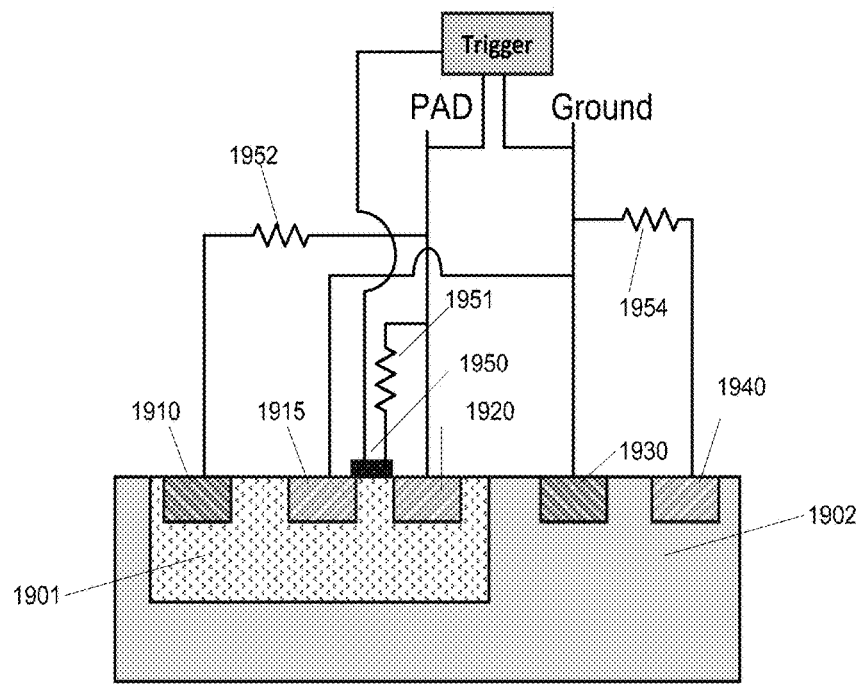
FIG. 19 shows a cross-sectional view of another embodiment of an ESD protection circuit including a trigger circuit.

As shown in FIG. 11, a gate 1150 may be disposed above the area between collector 1115 and emitter 1120, creating a MOS device. In that case collector 1115 is typically referred to as the drain and emitter 1120 is typically referred to as the source. Gate 1150 can be helpful to decrease the distance between source 1120 and drain 1115, as during processing this distance may be determined by the minimum dimensions of the gate mask, rather than the mask that defines the active area as described above. The created MOS device can be used in active MOS mode as well. A gate circuit can be connected such that during the ESD event MOS current can flow. A trigger circuit may be connected to the gate 1150 of the MOS device such as that shown by way of example in FIG. 19. A trigger circuit may be additionally or alternatively coupled to pad, additional region 1915, G2 trigger tap 1910, ground, anode 1920, and/or cathode 1930. Other connections for the trigger circuit may apply, such as those connections described above with respect to FIGS. 14-18.

Referring again to FIG. 10, note that although bipolar 1075 is shown as a one finger device, it is possible that bipolar 1075 is part of a multifinger bipolar. Likewise, as in the embodiment shown in FIG. 11, when gate 1150 is deposited, regions 1115, 1150, and 1120 may be one finger of a multifinger MOS device. In general, any number of fingers of the SCR can be combined with any number of bipolar or MOS fingers.

FIGS. 21A, 21B, 21C, 21D, 22A, 22B, 23A, 23B, 24A, 24B, 25A, and 25B show circuit diagrams of example embodiments of the disclosed ESD protection circuit.

In FIGS. 21A-21D, circuit diagrams of G2 triggered implementations are shown. Referring to FIG. 2, additional region 235 is represented in the circuit diagram as a reverse diode coupled between the base of the NPN and the anode, similarly shown as diode 286 in the cross-sectional diagram of FIG. 2. Different options for the connection of an explicit resistive element to the trigger gates are shown. These different options for the explicit resistive element may be combined with any of the other disclosed embodiments.

Figure 22A:
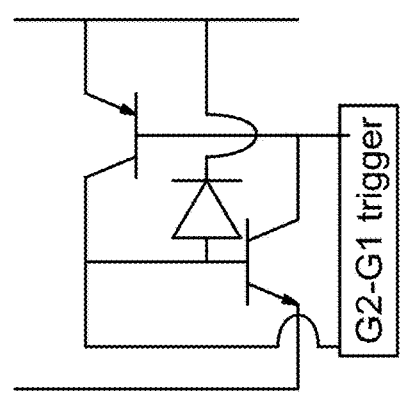
FIG. 22A shows a circuit diagram representation of an embodiment of an ESD protection circuit with G2-G1 triggering.
Figure 22B:
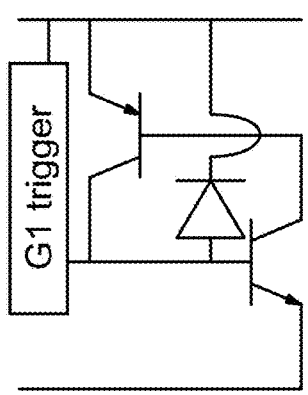
FIG. 22B shows a circuit diagram representation of an embodiment of an ESD protection circuit with G1 triggering.

FIGS. 22A and 22B show circuit diagrams for embodiments of ESD protection circuits with a trigger circuit coupled between G2 and G1 and a trigger circuit coupled to G1, respectively.

Figure 23A:
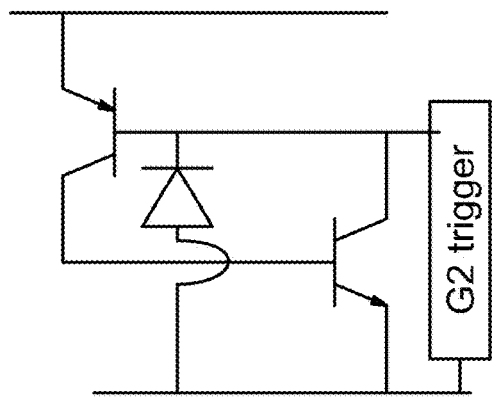
FIGS. 23A and 23B show circuit diagram representations of embodiments of ESD protection circuits.
Figure 23B:
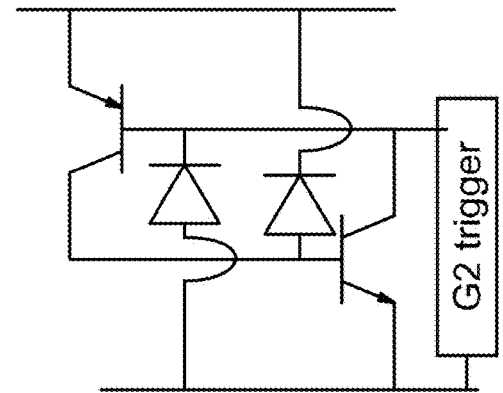

FIG. 23A shows a circuit diagram of an embodiment of an ESD protection circuit wherein, referring to FIG. 10, the additional region 1015 may be placed in the lowly doped N region 1001. Diode 1076 depicted in FIG. 10 is shown in FIG. 23A as a reverse diode between the base of the PNP and ground. FIG. 23B shows a circuit diagram of an embodiment of an ESD protection circuit similar to that shown in FIG. 13, wherein both additional region 1315 and 1335 may be placed.

Figure 24A:
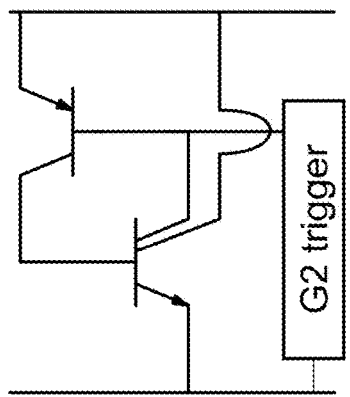
FIGS. 24A and 24B show circuit diagram representations of embodiments of ESD protection circuits.

FIG. 24A shows a circuit diagram of an embodiment of an ESD protection circuit such as that similarly shown in FIG. 2, wherein the NPN 285 is represented. The NPN is modeled in FIG. 24A as the depicted second collector, which may be further connected to the anode, as described above.

Figure 24B:
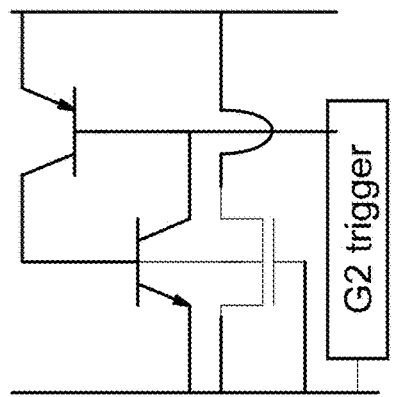

FIG. 24B shows a circuit diagram of an embodiment of an ESD protection circuit such as that similarly shown in FIG. 3. Gate 350 of FIG. 3 may form a MOS device with additional region 335 and cathode 330, and may be represented by the MOS as shown in FIG. 24B. By way of example, as shown in FIG. 24B, the gate of the MOS device may be connected to its source, and to the cathode of the SCR. As explained before, any circuit which gives appropriate biasing to the gate can be connected to it. The drain of the MOS, which may represent the additional region 335, may be connected, for example, to the anode of the SCR.

Figure 25A:
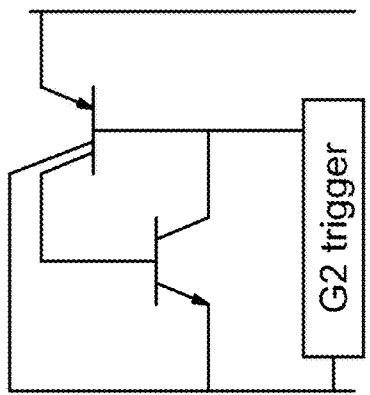
FIGS. 25A and 25B show circuit diagram representations of embodiments of ESD protection circuits.

By way of example, the complementary case of adding a region 1015 in the lowly doped N region 1001, such as that shown in FIG. 10, is modeled in the circuit diagram shown in FIG. 25A as a second collector of the PNP. By way of example as shown in FIG. 25A, the second collector may be connected to the cathode of the SCR.

Figure 25B:
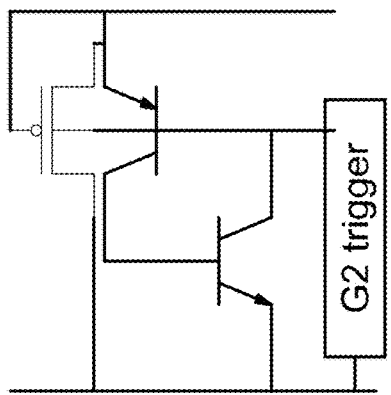

FIG. 25B shows a circuit diagram of an embodiment of an ESD protection circuit such as that similarly shown in FIG. 11. Gate 1150 of FIG. 11 may form a MOS device with additional region 1115 and anode 1020, and may be represented by the MOS as shown in FIG. 25B. By way of example as shown in FIG. 25B, the gate of the MOS device may be connected to its source, and to the anode of the SCR. As explained before, any circuit which gives appropriate biasing to the gate can be connected to it. The drain of the MOS, which may represent the additional region 1115, may be connected, for example, to the cathode of the SCR.

Note that for the connections to the anode disclosed herein, alternatives to those shown in the figures are possible. More specifically, if additional circuitry is placed between the protected node and the anode of the SCR (for instance one or multiple holding diodes), the additional region, for example region 235 of FIG. 2, can be connected to the anode, to the protected node, or to any other node in between.

Note that for the connections to the cathode disclosed herein, alternatives to those shown in the figures are possible. More specifically, if additional circuitry is placed between the protected node and the anode of the SCR (for instance one or multiple holding diodes), the additional region, for example region 1015 of FIG. 10, can be connected to the cathode, to the protected node, or to any other node in between.

Figure 26A:
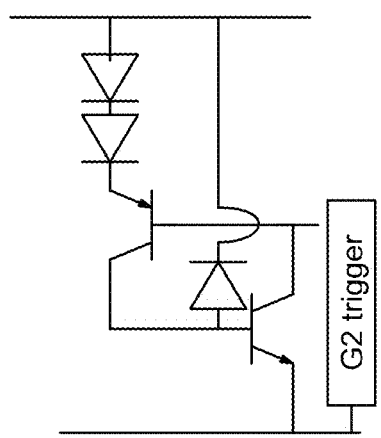
FIGS. 26A, 26B, 26C, 26D, 26E, and 26F show circuit diagram representations of embodiments of ESD protection circuits including holding diodes.
Figure 26B:
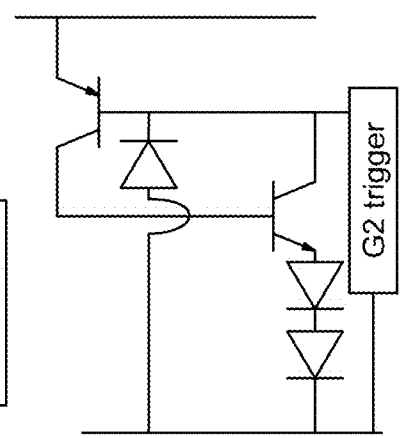
Figure 26C:
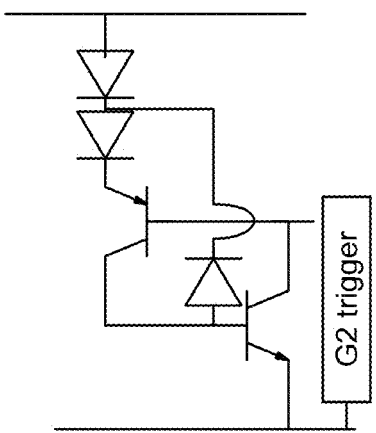
Figure 26D:
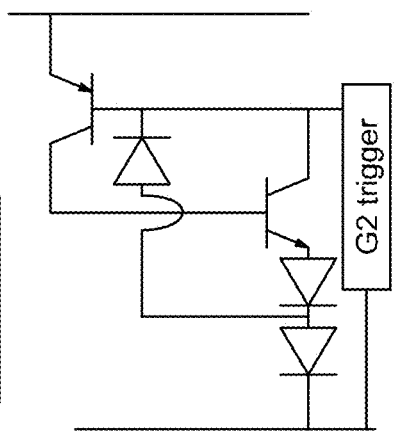
Figure 26E:
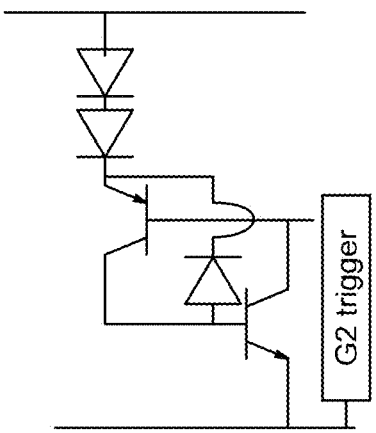
Figure 26F:
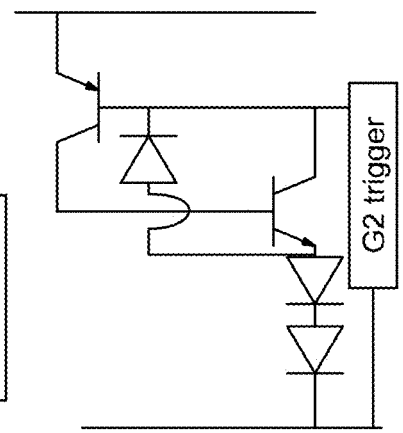

FIG. 26A-26F show embodiments of ESD protection circuits including examples of holding diode configurations, though it should be recognized other configurations are possible. FIG. 26A shows holding diodes coupled between pad and the anode with the additional region modeled as a reverse diode coupled to the pad. FIG. 26B shows holding diodes coupled between the cathode and ground with the additional region modeled as a reverse diode coupled to ground. FIG. 26C shows holding diodes coupled between pad and the anode with the additional region modeled as a reverse diode coupled between the holding diodes. FIG. 26D shows holding diodes coupled between the cathode and ground with the additional region modeled as a reverse diode coupled between the holding diodes. FIG. 26E shows holding diodes coupled between pad and the anode with the additional region modeled as a reverse diode coupled to the anode. FIG. 26F shows holding diodes coupled between the cathode and ground with the additional region modeled as a reverse diode coupled to the cathode.

Figures 27A, 27B:
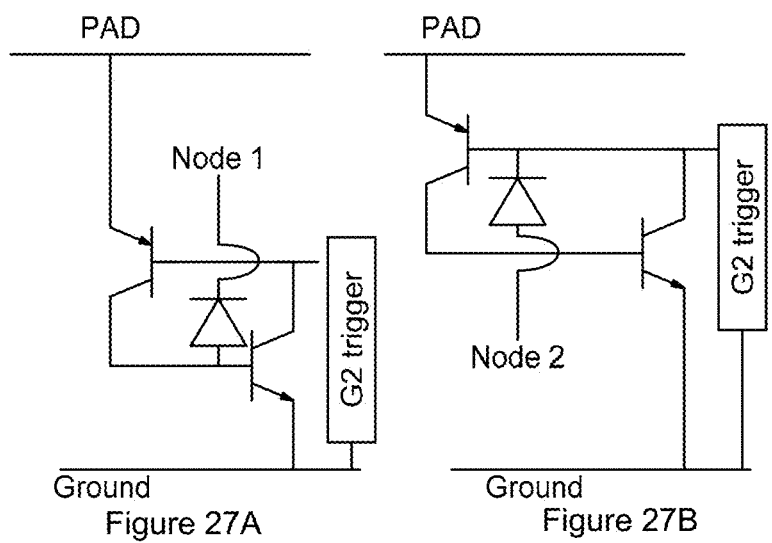
FIGS. 27A and 27B show circuit diagram representations of embodiments of ESD protection circuits.

FIG. 27A shows a circuit diagram of an embodiment of an ESD protection circuit with the additional region modeled as a reverse diode coupled to a Node 1, for example a supply line different from pad. In FIG. 27B, the reverse diode may be coupled to a different Node 2, such as another ground, different from the ground connected to the cathode.

In some embodiments, silicide block or another ballasting technique may be used on the additional region, such as additional region 235 of FIG. 2 or additional region 1015 of FIG. 10. This may improve the current uniformity along the width of region 235 or region 1015. In a circuit representation, this may be depicted as a resistance in series with the element representing the additional region, for instance the reverse diode, the second collector, or the MOS device as previously described and shown. Therefore, when a resistor is shown in a circuit schematic of an embodiment of the ESD protection circuit, this resistor may be explicit, or may be included in the additional region 235 or 1015 in the form of an implementation of ballasting techniques. Known ballasting techniques include silicide block, the addition of a lowly doped region around the additional regions 235 or 1015 of the same or opposite doping type as the respective additional region, the use of poly resistors, the use of back end elements such as contacts, vias, metallization, the use of segmentation within the active area, etc. Additional devices may be included in the connection of the additional region 235 or 1015 to other nodes, and may help to tune the voltage at which avalanching occurs. Examples of additional devices may be forward and/or reverse diodes, transistors, SCRs, inductors, capacitors, resistors, etc.

Figure 28A:
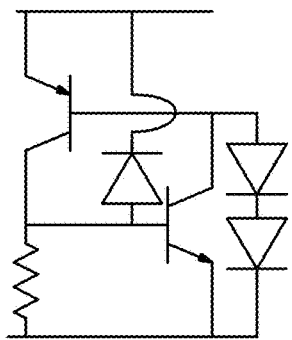
FIGS. 28A, 28B, 28C, 28D, 28E, 28F, 28G, 28H, and 28I show circuit diagram representations of embodiments of ESD protection circuits.
Figure 28B:
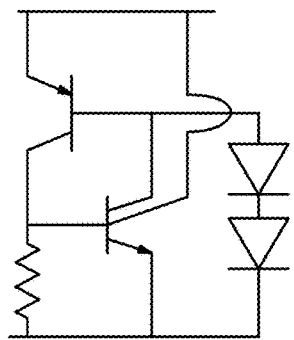
Figure 28C:
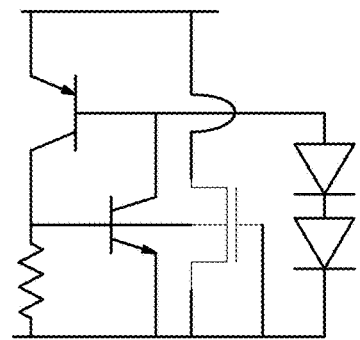
Figure 28D:
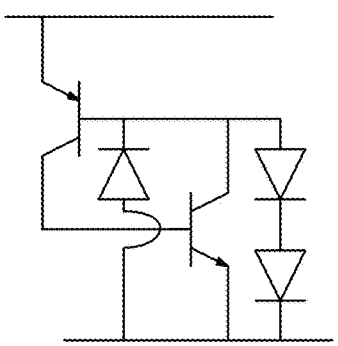
Figure 28E:
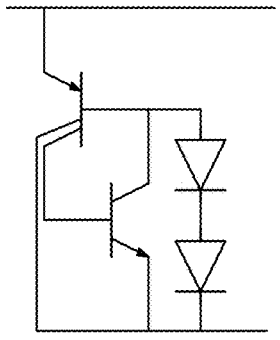
Figure 28F:
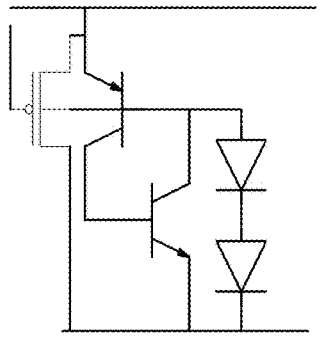
Figure 28G:
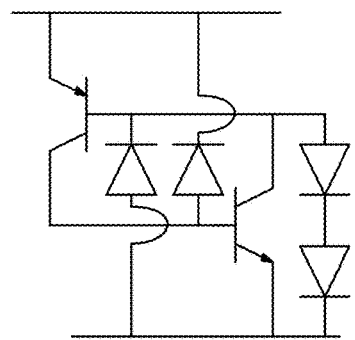
Figure 28H:
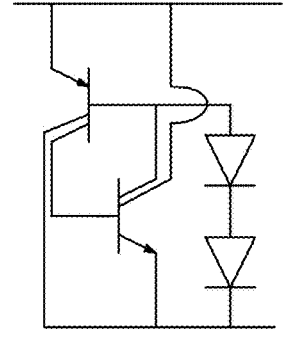
Figure 28I:
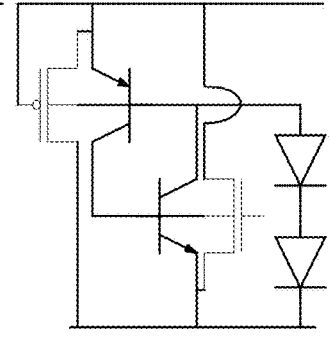

FIGS. 28A-28I show example embodiments of ESD protection circuits including a string of diodes that may act as a triggering device coupled to the G2 trigger gate to trigger the SCR. FIGS. 28A and 28B show the different possible schematic representations which an additional region is placed such as that shown in FIG. 2. FIG. 28C shows a schematic representation of an embodiment of an ESD protection device further including a gate such as that shown in FIG. 3. FIGS. 28D and 28E show the different possible schematic representations which an additional region is placed such as that shown in FIG. 10. FIG. 28F shows a schematic representation a schematic representation of an embodiment of an ESD protection device further including a gate such as that shown in FIG. 11. FIGS. 28G and 28H show the different possible schematic representations in which both additional regions are placed such as that shown in FIG. 13. FIG. 28I shows a schematic representation a schematic representation of an embodiment of an ESD protection device further including gates associated with the two additional regions such as a combination of that shown in FIGS. 3 and 11.

Though particular dimensions are shown for the regions and spacings throughout FIGS. 1-3, 4A, 4B, 4C, 4D, 5, 6, 7A, 7B, 8A, 8B, 9-19, 20A, 20B, and 20C, one should recognize regions and spacings of other dimensions are possible. Though the figures often depict ESD protection circuits in a single-finger layout, one should recognize embodiments shown in the figures may also be implemented as multi-finger layouts.

It should be recognized that the relative geometries, dimensions, and orientations depicted in the Figures are examples. Other relative geometries, dimensions, and orientations for regions and devices depicted may be implemented and are within the scope of the teachings disclosed herein. Further, it should be noted that though the terms "first" and "second" are used throughout the description, reference to a "second" device does not require the presence of a "first" device. Rather, the terms "first" and "second" are merely used as modifiers to distinguish one device from another. For example, an ESD protection device may be described as including a second diode without necessarily having a first diode such that there is only one diode in the example. This nomenclature applies to any elements, nodes, devices, or otherwise that are described herein and may be further applied to "third", "fourth", etc. without requiring the presence of three or four devices, respectively.

What is claimed is:

1. An electrostatic discharge (ESD) protection circuit coupled between a circuit anode and a circuit cathode, wherein the ESD protection circuit is configured to sink ESD current from the circuit anode to the circuit cathode, the ESD protection circuit comprising:
   a lowly doped P region;
   a lowly doped N region formed in the lowly doped P region;
   a first highly doped P region formed entirely within the lowly doped P region;
   a second highly doped N region formed entirely within the lowly doped P region, wherein the second highly doped N region is connected to the circuit cathode;
   a third highly doped P region formed entirely within the lowly doped N region;
   a fourth highly doped N region formed entirely within the lowly doped N region;
   a fifth highly doped N region formed entirely within the lowly doped P region, wherein the second highly doped N region is disposed between the fifth highly doped N region and the lowly doped N region;
   a trigger circuit coupled to at least one of the first highly doped P region or the fourth highly doped N region; and
   at least one of a serially coupled forward-biased diode or serially coupled metal oxide semiconductor (MOS) coupled between the circuit anode and the third highly doped region;
   wherein:
      the lowly doped N region, the lowly doped P region, and the second highly doped N region form an NPN transistor;
      the third highly doped P region, the lowly doped N region, and the lowly doped P form a PNP transistor;
      the fifth highly doped N region, the NPN transistor, and the PNP transistor form a silicon controlled rectifier (SCR);
      the second highly doped N region functions as the cathode of the SCR;
      the third highly doped P region functions as the anode of the SCR;
      the trigger circuit is external to the SCR and the trigger circuit sets a voltage at which the SCR turns on; and
      the fifth highly doped N region speeds up the SCR turning on in response to an ESD event.

2. The ESD protection circuit of claim 1, wherein the fifth highly doped N region is directly connected to the circuit anode.

3. The ESD protection circuit of claim 1, wherein the fifth highly doped N region is directly connected to the third highly doped P region.

4. The ESD protection circuit of claim 1, wherein the at least one of a serially coupled forward-biased diode or serially coupled metal oxide semiconductor (MOS) device includes at least two of the serially coupled forward-biased diodes or serially coupled MOS devices, and wherein the fifth highly doped N region is directly connected to a node between any two of the of the at least two serially coupled forward-biased diodes or serially coupled MOS devices.

5. The ESD protection circuit of claim 1, wherein no highly doped regions are placed between the third highly doped P region and the second highly doped N region.

6. The ESD protection circuit of claim 1 further comprising a gate, disposed above an area between the second highly doped N region and the fifth highly doped N region.

7. The ESD protection circuit of claim 6, further comprising:
   a resistor coupled between the gate and the circuit cathode; and
   a capacitor coupled between the gate and the circuit anode.

8. The ESD protection circuit of claim 1, wherein the trigger circuit comprises at least one of a transistor, a resistor, a diode, a capacitance, and an inductor.

9. The ESD protection circuit of claim 1, wherein no highly doped regions are placed between the second highly doped N region and the fifth highly doped N region.

10. The ESD protection circuit of claim 1, wherein the distance between the second highly doped N region and the fifth highly doped N region is minimized.

11. The ESD protection circuit of claim 1, further comprising a sixth highly doped P region formed entirely within the lowly doped N region, wherein the sixth highly doped P region is coupled to the second highly doped N region.

12. The ESD protection circuit of claim 11, wherein the second highly doped N region is disposed between the fifth highly doped N region and the lowly doped N region, and wherein the third highly doped P region is disposed between the sixth highly doped P region and the lowly doped P region.

13. An electrostatic discharge (ESD) protection circuit coupled between a circuit anode and a circuit cathode, the ESD protection circuit comprising:
  a first lowly doped region of a first conductivity type;
  a second lowly doped region of a second conductivity type, wherein a junction is formed between the first lowly doped region and the second lowly doped region;
  a first highly doped region of the first conductivity type formed entirely within the first lowly doped region;
  a second highly doped region of the second conductivity type formed entirely within the first lowly doped region;
  a third highly doped region of the first conductivity type formed entirely within the second lowly doped region;
  a fourth highly doped region of the second conductivity type formed entirely within the second lowly doped region;
  a fifth highly doped region of the second conductivity type formed entirely within the first lowly doped region, wherein the fifth highly doped region is connected to a voltage supply that is not the circuit anode, wherein the second highly doped region, the third highly doped region, and the fifth highly doped regions are disposed between the fourth highly doped region and the first highly doped region, and further wherein no highly doped regions are placed between the third highly doped region and the second highly doped region; and
  a trigger circuit coupled to at least one of the first highly doped region or the fourth highly doped region;
  wherein:
    the first lowly doped region, the second lowly doped region, the second highly doped region, the third highly doped region, and the fifth highly doped region form a silicon controlled rectifier (SCR);
    the trigger circuit is external to the SCR and the trigger circuit sets a voltage at which the SCR turns on; and
    the fifth highly doped region speeds up the SCR turning on in response to an ESD event.

14. The ESD protection circuit of claim 13, wherein the first conductivity type is a P conductivity type, the second conductivity type is a N conductivity type, the second lowly doped region is formed within the first lowly doped region, the third highly doped region functions as the anode of the SCR and is connected to the circuit anode, the second highly doped region functions as the cathode of the SCR and is connected to the circuit cathode, and the second highly doped region is disposed between the fifth highly doped region and the second lowly doped region.

15. The ESD protection circuit of claim 13, wherein the first conductivity type is a N conductivity type, the second conductivity type is a P conductivity type, the first lowly doped region is formed within the second lowly doped region, the second highly doped region functions as the anode of the SCR and is connected to the circuit anode, the third highly doped region functions as the cathode of the SCR, and the second highly doped region is disposed between the fifth highly doped region and the junction formed between the first lowly doped region and the second lowly doped region.

16. The ESD protection circuit of claim 15, further comprising:
  at least one of a serially coupled forward-biased diode or serially coupled metal oxide semiconductor (MOS) coupled between third highly doped region and the circuit cathode.

17. The ESD protection circuit of claim 16, wherein the fifth highly doped region is directly connected to the circuit cathode.

18. The ESD protection circuit of claim 16, wherein the fifth highly doped region is directly connected to the third highly doped region.

19. The ESD protection circuit of claim 16, wherein the at least one of a serially coupled forward-biased diode or serially coupled MOS device includes at least two of the serially coupled forward-biased diodes or serially coupled MOS devices, and wherein the fifth highly doped region is directly connected to a node between any two of the of the at least two serially coupled forward-biased diodes or serially coupled MOS devices.

20. The ESD protection circuit of claim 16, further comprising a gate, disposed above an area between the second highly doped region and the fifth highly doped region.

21. The ESD protection circuit of claim 20, further comprising:
  a resistor coupled between the gate and the circuit anode; and
  a capacitor coupled between the gate and the circuit cathode.

22. The ESD protection circuit of claim 16, wherein the trigger circuit comprises at least one of a transistor, a resistor, a diode, a capacitance, and an inductor.

* * * * *